United States Patent [19]
Maegawa et al.

[11] Patent Number: 5,950,067
[45] Date of Patent: Sep. 7, 1999

[54] METHOD OF FABRICATING A THERMOELECTRIC MODULE

[75] Inventors: Nobuteru Maegawa, Katano; Hiroaki Okada, Nara-ken; Michimasa Tsuzaki, Neyagawa; Yuri Sakai, Hirakata; Katsuyoshi Shimoda, Hikone; Teruaki Komatsu, Hikone; Shinya Murase, Hikone; Hiroyuki Inoue, Hikone; Masayuki Sagawa, Hikone, all of Japan

[73] Assignee: Matsushita Electric Works, Ltd., Osaka, Japan

[21] Appl. No.: 08/973,095

[22] PCT Filed: Jun. 3, 1997

[86] PCT No.: PCT/JP97/01797

§ 371 Date: Mar. 19, 1998

§ 102(e) Date: Mar. 19, 1998

[87] PCT Pub. No.: WO97/45882

PCT Pub. Date: Dec. 4, 1997

[30] Foreign Application Priority Data

| May 27, 1996 | [JP] | Japan | P08-157677 |
| May 28, 1996 | [JP] | Japan | P08-133996 |
| May 28, 1996 | [JP] | Japan | P08-133997 |
| May 28, 1996 | [JP] | Japan | P08-157675 |

[51] Int. Cl.$^6$ ................................................. H01L 21/324
[52] U.S. Cl. .............................. 438/22; 257/62; 257/633; 257/930
[58] Field of Search ............................... 438/22; 257/62, 257/633, 930

[56] References Cited

U.S. PATENT DOCUMENTS

| 2,980,746 | 4/1961 | Claydon . |
| 3,276,105 | 10/1966 | Alais et al. . |
| 3,560,351 | 2/1971 | Abbott et al. . |
| 3,780,425 | 12/1973 | Penn et al. . |
| 3,781,176 | 12/1973 | Penn et al. . |
| 3,851,381 | 12/1974 | Alais et al. . |
| 3,959,324 | 5/1976 | Alais et al. . |
| 4,493,939 | 1/1985 | Blaske et al. . |
| 5,705,434 | 1/1998 | Imanishi et al. . |

FOREIGN PATENT DOCUMENTS 63-110680   5/1988   Japan .

*Primary Examiner*—Chandra Chaudhari
*Assistant Examiner*—Martin Sulsky
*Attorney, Agent, or Firm*—Nikaido Marmelstein Murray & Oram, LLP.

[57] ABSTRACT

A method of fabricating a thermoelectric module in which a plurality of thermoelectric chips are arranged in a matrix between first and second dielectric substrates and electrically connected in series so as to heat one of the substrates and cool the other substrate. Elongated thermoelectric bars of P-type and N-type to be cut into the chips are employed together with a first conductive plate having a plurality of first contacts arranged in a matrix pattern. Adjacent first contacts spaced along the row are interconnected by horizontal bridges. The method of the present invention comprises the steps of integrating the first conductive plate to the first substrate to support the first conductive plate thereby; placing a plurality of the bars of the P-type and N-type on the first contacts along the rows in such a manner that the P-type bars alternate with the N-type bars in a spaced relation along the column; bonding each bar on its one face to the first contacts; cutting each bar into the chips and cutting the horizontal bridges simultaneously to allocate the chips on the individual first contacts; placing a plurality of second contacts of a second substrate onto the chips to form a series electric circuit of the chips in combination with the first contacts, and bonding the second substrate supporting the second contacts to the first substrate.

37 Claims, 20 Drawing Sheets

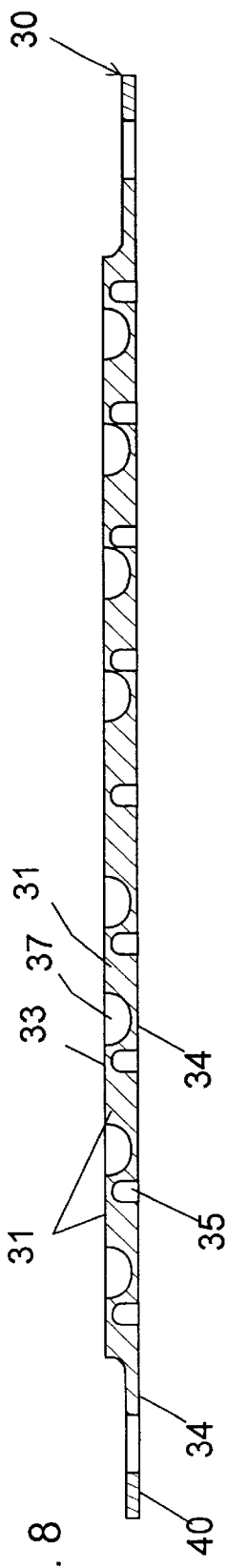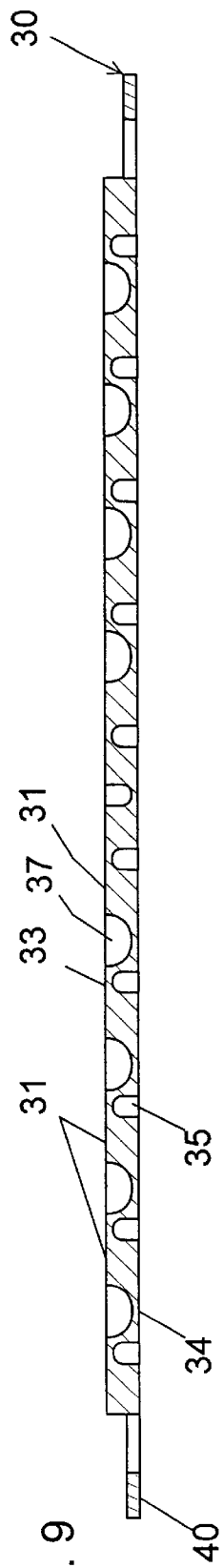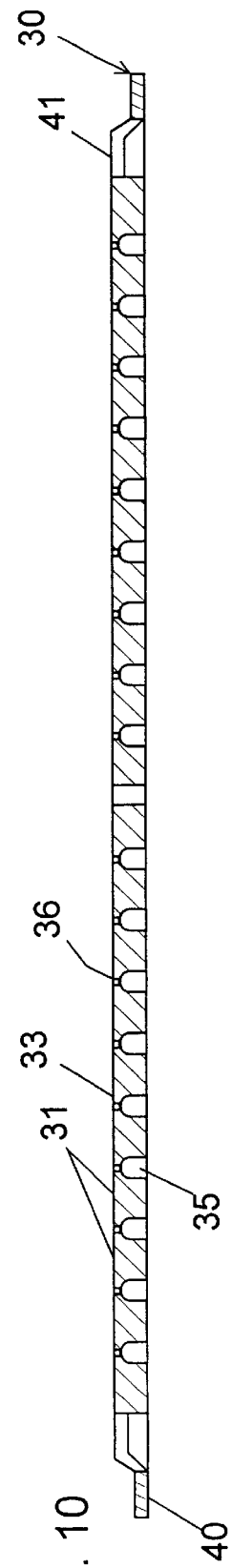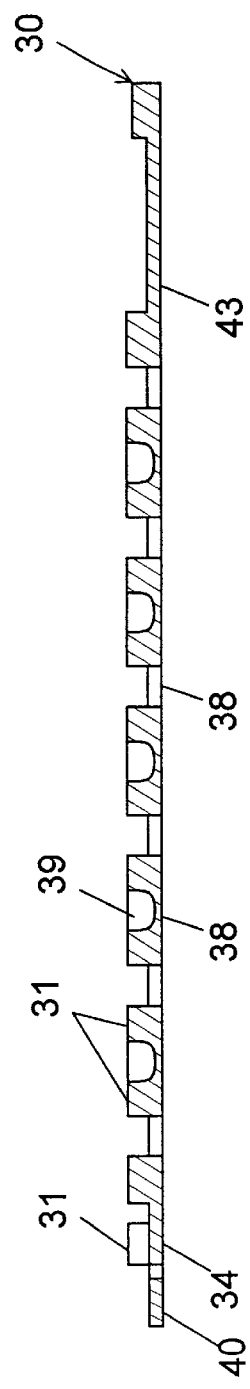

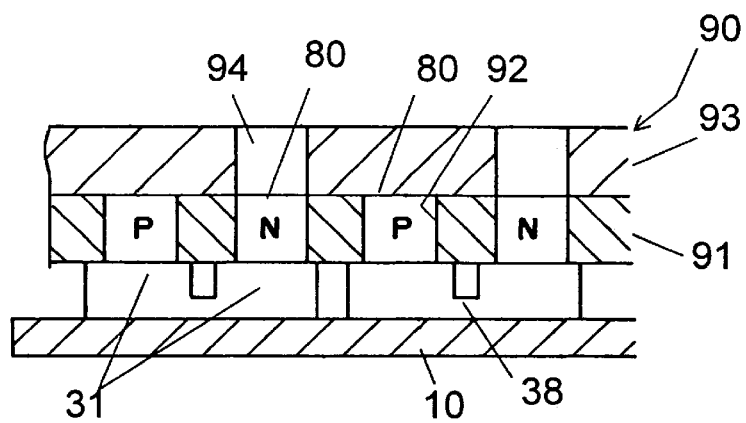
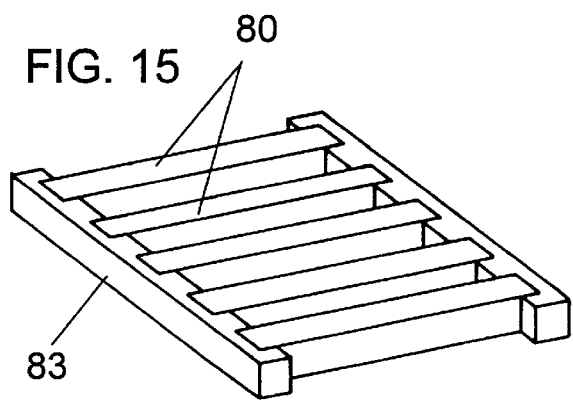
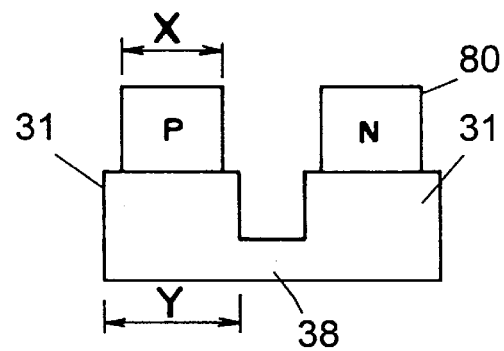
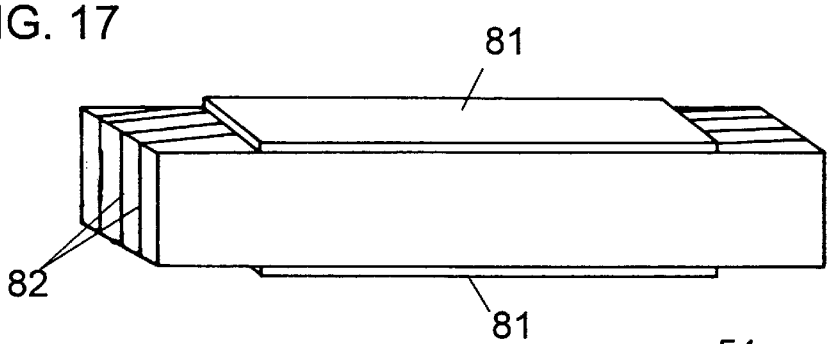
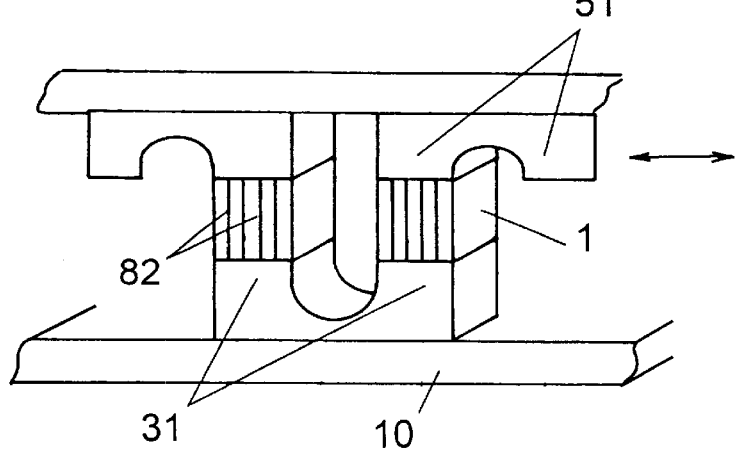

FIG. 30A
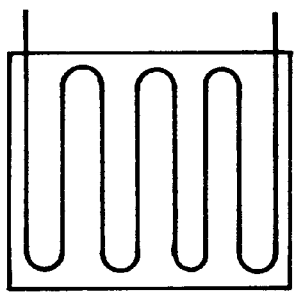
FIG. 30B
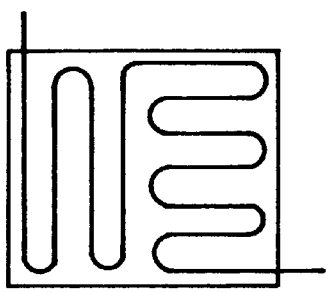
FIG. 30C
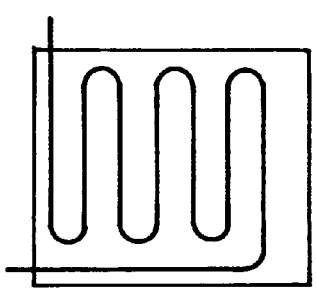
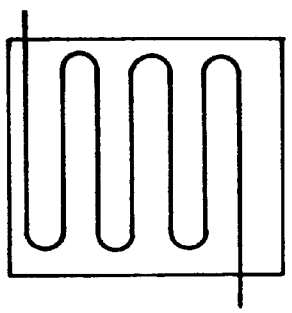
FIG. 30D
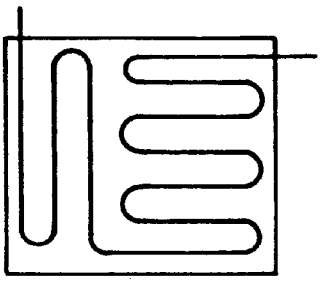
FIG. 30E
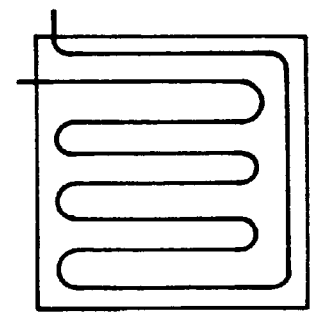
FIG. 30F
FIG. 31A
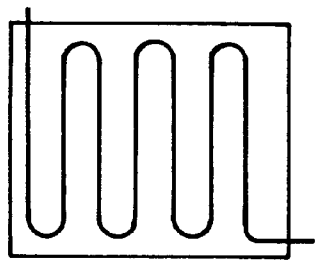
FIG. 31B
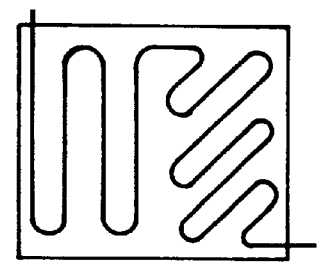
FIG. 31C
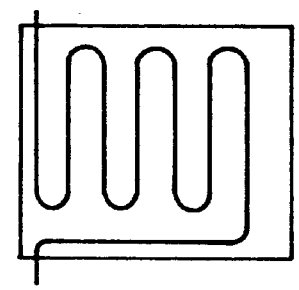
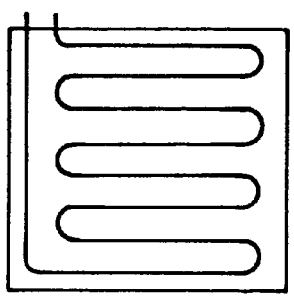
FIG. 31D
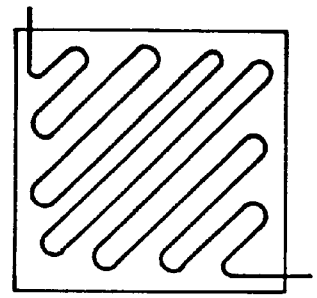
FIG. 31E
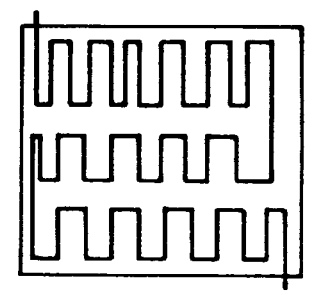
FIG. 31F

1

METHOD OF FABRICATING A THERMOELECTRIC MODULE

TECHNICAL FIELD

The present invention relates to a method of fabricating a thermoelectric module composed of a plurality of thermoelectric chips arranged between a pair of dielectric substrates and electrically connected in series to each other so as to heat one of the substrates and cool the other substrate due to the Peltier effect obtained in the individual thermoelectric chips.

BACKGROUND ART

Japanese Patent Publication No. 38-25925 discloses a method of fabricating a conventional thermoelectric module. In this method, a plurality of elongated P-type and N-type thermoelectric bars are arranged alternately and bonded between a pair of conductive plates, after which they are cut along a direction perpendicular to the length of the bar together with the plates so that each bar is cut into a plurality of thermoelectric chips each having on its upper and lower faces individual contacts formed from the separated conductive plates. The resulting chips are electrically connected in series through the contacts. When preparing the thermoelectric module having the thermoelectric chips arranged in a matrix with this method, it is possible to provide a plurality of staggered lines of cut from the opposite directions to the conductive plates. However, it is difficult to hold the thermoelectric bars as well as the conductive plates in accurate positions during such cutting operation. With this result, not only the accurate cutting may not be made to the thermoelectric bars and the conductive plates, but also the resulting thermoelectric module has the lines of cut forming such a zig-zag pattern that the thermoelectric chips on one side of the line of cut is connected to those on the other side of the line of cut only through the contact at one end of the line of cut. Therefore, there remains a problem in that a great care has to be paid for maintaining such module in a correct posture until it is assembled between a pair of substrates forming heat radiating panel and cooling panel, respectively.

DISCLOSURE OF THE INVENTION

The present invention has been accomplished in view of the above problem and has a primary object of providing a method of fabricating a thermoelectric module in an easy and accurate manner. The method according to the present invention is for fabricating the thermoelectric module which is composed of a plurality of thermoelectric chips arranged in a matrix between a pair of first and second dielectric substrates and electrically connected in series to each other so as to heat a side of the first substrate and cool a side of the second substrate due to the Peltier effect obtained in the thermoelectric chips. The method utilizes a plurality of elongated thermoelectric bars of P-type and N-type to be separated into the thermoelectric chips and a first conductive plate carrying a plurality of first contacts arranged in a matrix, the adjacent ones of the first contacts arranged in a row of the matrix are interconnected respectively by horizontal bridges, while the first contacts are spaced along a column of the matrix. The method comprises the steps of integrating the first conductive plate to the first substrate to support the first conductive plate by the first substrate; placing a plurality of the elongated thermoelectric bars of P-type and N-type on the first contacts along the row in such a manner that P-type bars alternate the N-type bars in a spaced relation along the column of the matrix; bonding each elongated thermoelectric bar on its one face to the row of the first contacts; cutting each elongated thermoelectric bar into the thermoelectric chips as well as cutting the horizontal bridges simultaneously to allocate the resulting thermoelectric chips on the individual first contacts; placing a plurality of second contacts on the chips opposite of the first contacts to form a series electric circuit of the chips in combination with the first contacts, and bonding a second substrate supporting the second contacts to the first substrate for connection therebetween. The characterizing feature of the present invention resides in that the cutting is made simultaneously to the thermoelectric bars as well as to the horizontal bridges physically interconnecting the first contacts, after holding the first contacts on the first substrate. Thereby, the thermoelectric bars on the first contacts can be securely supported together with the first contacts by the first substrate, enabling to cut the thermoelectric bars into the corresponding chips easily and accurately. Since thus formed thermoelectric chips can be supported together with the first contacts by the first substrate, they can be held stably in positions during a subsequent assembly of the module, realizing an easy assembly of the module.

The first and second substrates are each made of a ceramic material or dielectric plastic material. When using the ceramic, the first conductive plate is supported on the ceramic substrate. When using the plastic material, the first conductive plate is molded in the plastic substrate to expose the first contacts thereon.

Preferably, the second contacts are arranged on the second conductive plate in a matrix in the like manner as the first contacts, and are supported to a ceramic or plastic substrate.

The thermoelectric bar is an elongated member having opposed upper and lower faces, opposite side faces, and opposite end faces at the longitudinal ends thereof, and having cleavage planes extending generally along the opposed side faces. The upper and lower faces of the bar extending generally perpendicular to the cleavage planes are bonded respectively to the first and second contacts. Because of the cutting of the bars is made at a right angle substantially to the cleavage planes, the bar can be cut into pieces of definite dimensions accurately without causing fracture along the cleavage planes.

When a plurality of the thermoelectric bars are integrated into a unitary structure by a dielectric material before being placed on the first contacts, the bars can be readily positioned at once on the first contacts for enhanced assembly efficiency.

The horizontal bridges of the first conductive plate are configured to be spaced from the opposed surface of the first substrate when placed thereon, such that the bridges can be cut easily together with the thermoelectric bars without being interfered with the first substrate.

Preferably, the first substrate is made of alumina and the first conductive plate is made of a copper or copper alloy to have the first contacts and the horizontal bridges as integral parts thereof. The first conductive plate is bonded to the first substrate by the direct bonding copper (DBC) technique. With the use of the DBC (Direct Bonding Copper), the first conductive plate can be easily bonded to the first substrate.

The first conductive plate is of a unitary structure including a frame surrounding the matrix of the first contacts and integrally connected thereto. The frame in addition to the first contacts is directly bonded to the first substrate so that the first conductive plate, i.e., the first contacts can be bonded securely to the first substrate. The frame has a thickness slightly greater than the first contacts so as to reduce possible warp or distortion of the first conductive plate when bonded to the first substrate by the DBC technique.

When forming the individual matrices of the thermoelectric chips on opposite surfaces of the first substrate for providing two series circuits of the thermoelectric chips, the first conductive plate is bonded on each of the opposite surfaces of the first substrate. The first conductive plates have respective expansion terminals which are disposed at one ends of the first substrates in a closely adjacent relation to each other such that the two series circuits are interconnected at the expansion terminals. Thus, the chips can have a three-dimensional arrangement to increase the amount of heating and cooling at the thermoelectric module.

The conductive plate is of a unitary structure having the matrix of the first contacts and bridge members integrally interconnecting the first contacts. The bridge members are composed of the horizontal bridges interconnecting the first contacts arranged along the row of the matrix and vertical bridges interconnecting two adjacent first contacts arranged in pairs along the column of the matrix. The pairs of the first contacts interconnected by the vertical bridges in one column of the matrix being staggered with respect to the pairs of the interconnected first contacts in the adjacent column of the matrix so that the first contacts of the matrix are interconnected through the horizontal and vertical bridges. The horizontal and vertical bridges have a thickness less than the first contacts. By the provision of such thin vertical and horizontal bridges uniformly distributed in the first conductive plate, these bridges can act to absorb heat stress which, upon bonding the copper-made first conductive plate to the ceramic first substrate by the DBC technique, develops in a high temperature processing necessary for such bonding due to a difference in expansion coefficient between the copper plate and the ceramic substrate, thereby enabling the bonding of the first conductive plate to the first substrate while correctly maintaining the arrays of the first contacts.

Further, the horizontal bridge is formed with a recess for absorbing the heat stress applied to the first conductor plate when the first conductor plate is bonded to the first substrate, so that more reliable bonding can be made between the first conductive plate and the first substrate. Thus, the thin horizontal bridges are made flush with the upper surface of the first conductive plate mounting the thermoelectric bar, while forming the bottom-opened recesses between the first contacts arranged along the row of the matrix.

Also, the vertical bridge defines another recess with respect the adjacent first contacts for absorbing heat stress applied to the first contacts. The thin vertical bridges are made flush with the lower surface of the first contacts to which the first substrate is bonded, thus forming the top-opened recesses between the adjacent first contacts.

Further, the first conductor plate may include a pair of matrices of the first contacts and provide an elongated slit for separating the matrices in the row direction.

When molded into the plastic first substrate, the first conductive plate is likewise configured to be of a unitary structure having the matrix of the first contacts and bridge members integrally interconnecting the first contacts. The bridge members are composed of the horizontal bridges interconnecting the first contacts arranged along the row of the matrix and the vertical bridges interconnecting two adjacent first contacts arranged in pairs along the column of the matrix. The pairs of the first contacts interconnected by the vertical bridges in one column of the matrix are staggered with respect to the pairs of the interconnected first contacts in the adjacent column of the matrix so that the first contacts of the matrix are interconnected through the horizontal and vertical bridges. The plastic material forming the first substrate fills spaces between the rows of the first contacts as well as between adjacent pairs of the first contacts arranged along the column of the matrix. With the consequence of the first conductive plate being molded in the plastic material, it is made possible to reduce a thickness of the whole assembly as well as to ensure electrical insulation among the first contacts.

The first conductive plate is of the unitary structure having, in addition to the first contacts and the horizontal and vertical bridges, an electrical terminal for connection with an external power source, requiring no additional separate component for connection with the power source.

The electrical terminal is integrally connected to the matrix of the first contacts through a plurality of removable joints at different portions of the matrix such that the number of the thermoelectric chips forming the series circuit thereof can be adjusted by selectively leaving one of the joints while cutting off the other joints. Thus, the thermoelectric module developing different heating and cooling amounts can be made as necessary.

Preferably, the frame of the first conductive plate is formed with a portion for receive a temperature sensor utilized for temperature control of the thermoelectric module.

When molded in the plastic first substrate, the first conductive plate is configured to expose the first contacts on opposite surfaces of the first substrate at substantially equal exposure ratio of the first contacts to the first substrate, thereby minimizing possible warp or distortion to make the thermoelectric module of stabilized quality.

When using the ceramic first substrate mounting the first conductive plate, the associated second conductive plate may be molded in the plastic second substrate. When molding in the first conductive plate in the plastic first substrate, the associated second conductive plate may be supported on the ceramic second substrate. Anyway, since the first and second conducive plates are removed of unnecessary portions after being mounted on the first and second substrates, respectively to form the first and second contacts, the matrix of first and second contacts can be held in a stable format for increased reliability of the resulting thermoelectric module.

Also, the use of the first and second conductive plates of the same configuration can reduce the number of components attendant with increased productivity.

The thermoelectric bar is coated on its surface to be bonded to the first contacts with a welding layer of at least one material selected from the group consisting of Sn, Bi, Ag, and Au for enhanced bonding strength to the ceramic first substrate.

Also, when the thermoelectric bar is coated on its surface to be bonded to the first contacts with a welding layer of Cu, it is equally possible to enhance the bonding strength to the first substrate.

A sealing enclosure is held between the first and second substrates for sealing the series circuit of the thermoelectric chips and the associated first and second contacts between the first and second substrates in order to enhance durability of the thermoelectric module. Preferably, the sealing enclosure is bonded to the frame integrally formed in the first conductive plate on the first substrate as well as to the frame integrally formed in the second conductive plate on the second substrate for providing a good seal. Further, secure bonding to the frames of the first and second conductive plates can be made by providing suitable plated layers on opposite faces of the sealing enclosure.

In addition, the sealing enclosure may be formed as an integral part of one of the first and second substrates made of plastic material to reduce the number of components.

The first and second conductive plates are each configured to include the electrical terminal disposed outwardly of the sealing enclosure for connection with the external power source.

The thermoelectric bar is selected to have a width less than the corresponding width of the first contact so that the opposite faces of the thermoelectric chips cut out from the bar can be brought into contact on its entire area with the associated first and/or second contacts, thereby transferring the heat developed at the chips effectively to the first and/or second contacts for effective heating and cooling, while avoiding the chips from accumulating heat stress which would otherwise lead to the fracture of the chips.

BRIEF DESCRIPTION OF THE DRAWINGS

FIG. 8 is a cross-section taken along line A—A of FIG. 4;

FIG. 9 is a cross-section taken along line B—B of FIG. 4;

FIG. 10 is a cross-section taken along line C—C of FIG. 4;

FIG. 11 is a cross-section taken along line D—D of FIG. 4;

FIG. 14 is a partial view of a jig for mounting the thermoelectric bars utilized in the thermoelectric module;

FIG. 15 is a perspective view of a dielectric member for holding the thermoelectric bars;

FIG. 16 is a sectional view illustrating a relation between contacts and the thermoelectric bars in the module;

FIG. 17 is a perspective view illustrating cleavage planes of the thermoelectric bar;

FIG. 18 is an explanatory view illustrating a relation between the cleavage planes of the thermoelectric chips and the first and second contacts;

FIGS. 30A, 30B, 30C, 30D, 30E, and 30F are schematic views respectively illustrating various series circuits of the thermoelectric chips adapted to the above thermoelectric module;

FIGS. 31A, 31B, 31C, 31D, 31E, and 31F are schematic views respectively illustrating other various series circuits of the thermoelectric chips adapted to the above thermoelectric module;

BEST MODE FOR CARRYING OUT THE INVENTION

Figure 1:
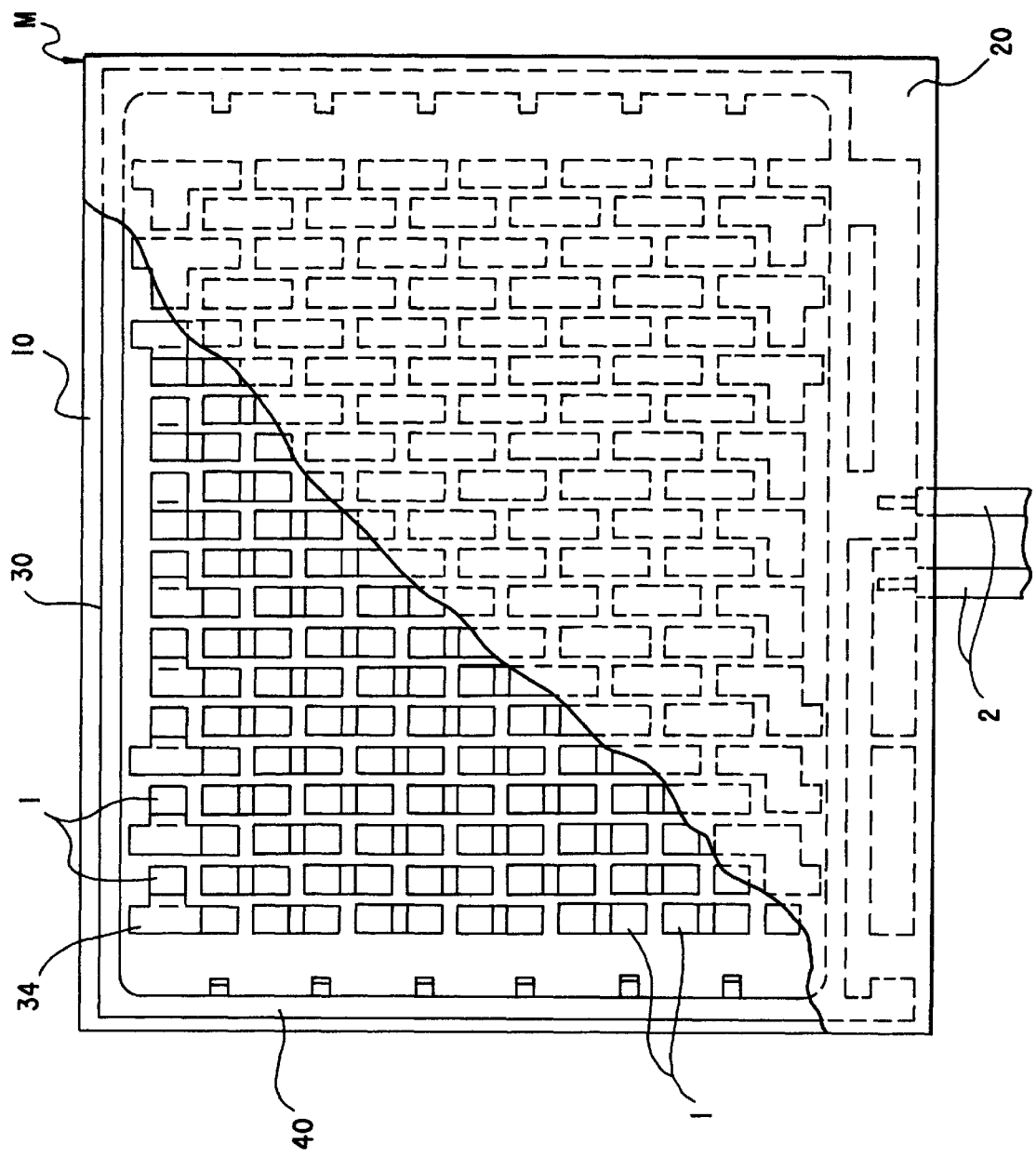
FIG. 1 is a top view, partially broken away, of a thermoelectric module obtained by a method in accordance with one embodiment of the present invention.
Figure 2:
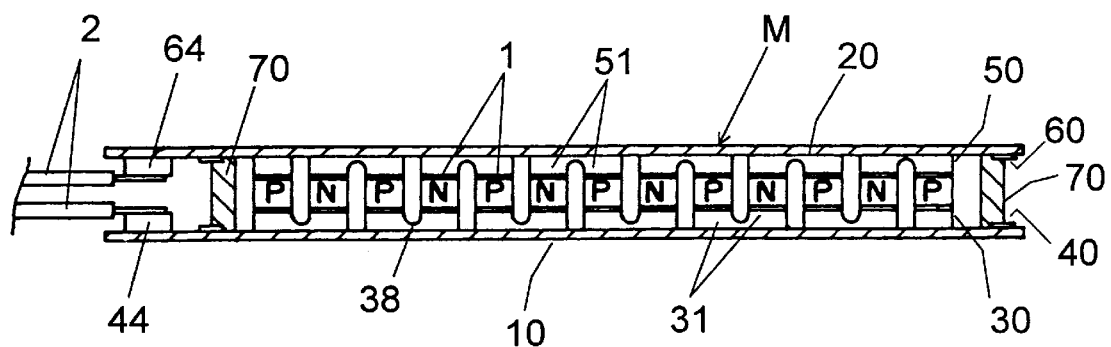
FIG. 2 is a longitudinal cross section of the above thermoelectric module.
Figure 3:
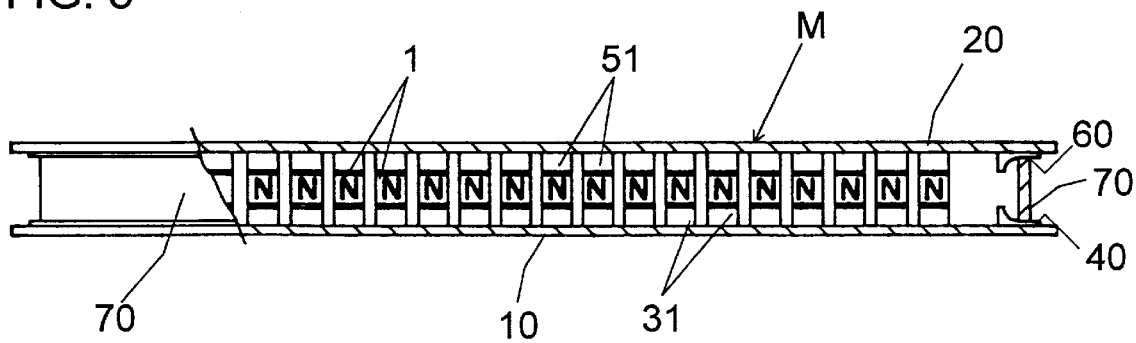
FIG. 3 is a transverse cross section of the above thermoelectric module.

A thermoelectric module in accordance with one embodiment of the present invention is now discussed herein. As shown in FIGS. 1 to 4, the thermoelectric module M comprises a plurality of P-type and N-type thermoelectric chips 1 arranged in a matrix between a pair of a first substrate 10 and a second substrate 20, and electrically connected by means of first and second contacts 31 and 51 formed respectively on the first and second substrate to form a series circuit. Opposite ends of the series circuit are defined by electrical terminals 44 and 64 which are formed integrally with the first and second contacts 31 and 51, respectively, and are connected through leads 2 to an external electrical source for supplying an electric current through the thermoelectric chips. Whereby, the thermoelectric chips give off heat on one face bonded to the first substrate 10 and at the same time absorb heat on the other face bonded to the second substrate 20, thereby heating the first substrate 10 and cooling the second substrate 20. Disposed between the first and second substrates 10 and 20 is a sealing enclosure 70 which surrounds hermetically the thermoelectric chips 1 and the associated first and second contacts.

As shown in FIG. 1, the thermoelectric chips 1 are arranged in a matrix such that the chips of the same type are aligned along a row of the matrix and the chips of the P-type and N-type are aligned alternately along a column of the matrix. The chips 1 on each row is formed by cutting an elongated thermoelectric bar 80, a semiconductor having main elements of Bi—Te—Sb—Se, mounted on the first substrate 10.

Figure 4:
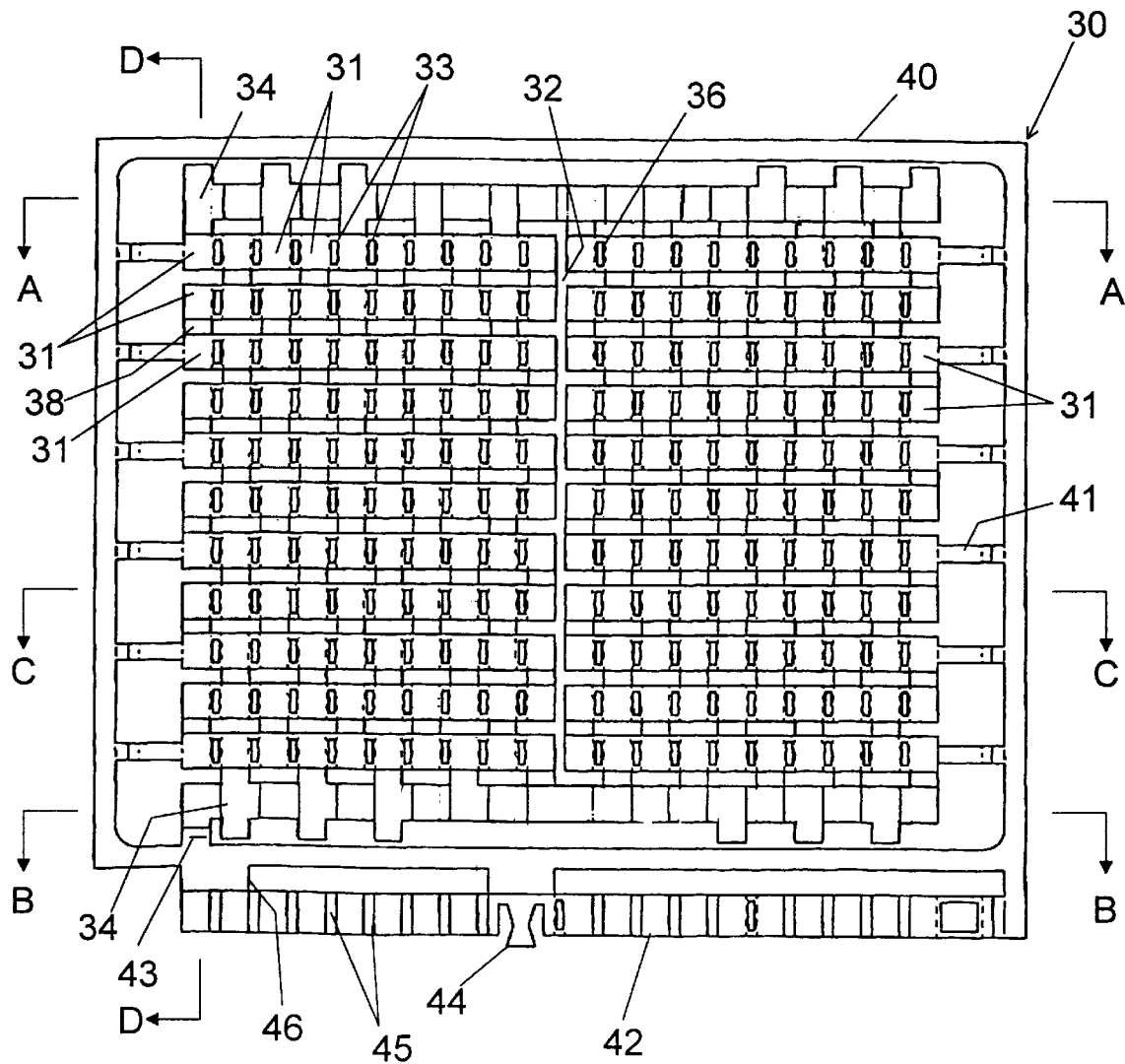
FIG. 4 is a plan view of a first conductive plate utilized for the thermoelectric module.
Figure 5:
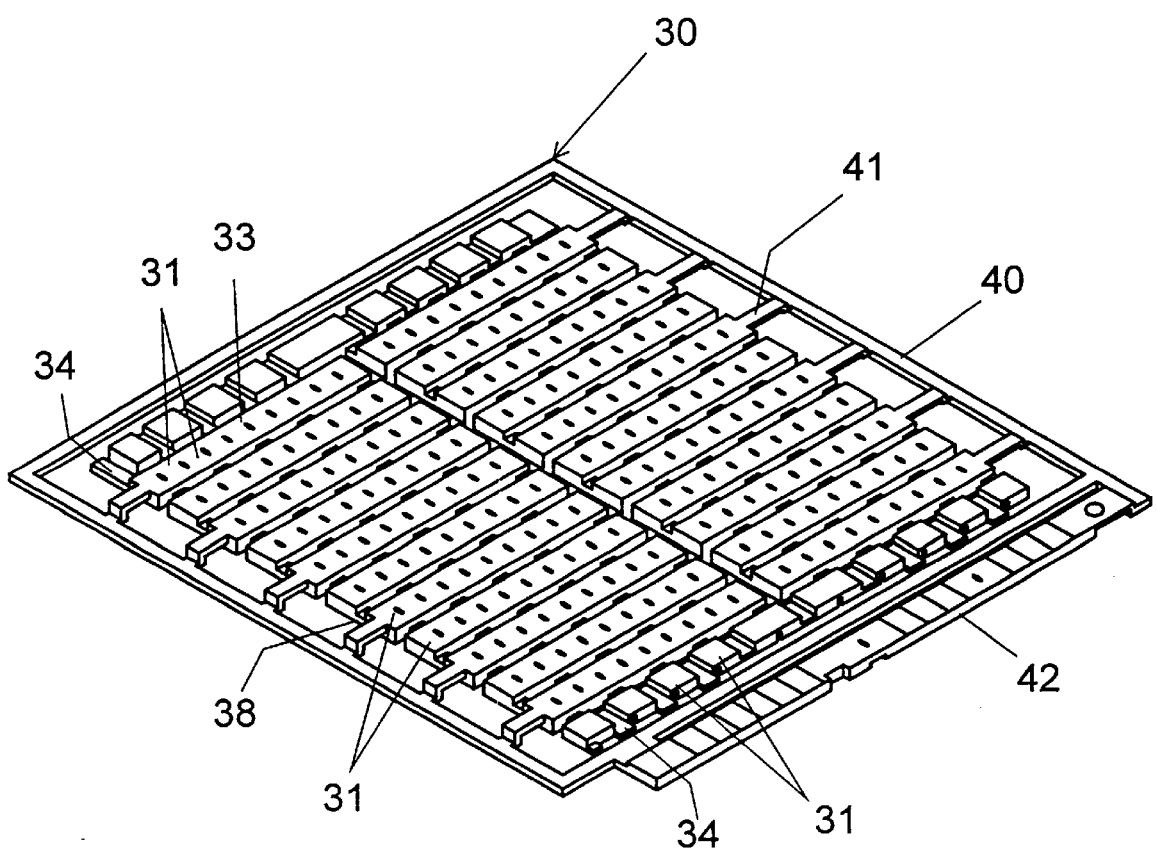
FIG. 5 is a perspective view of the first conductive plate.
Figure 6:
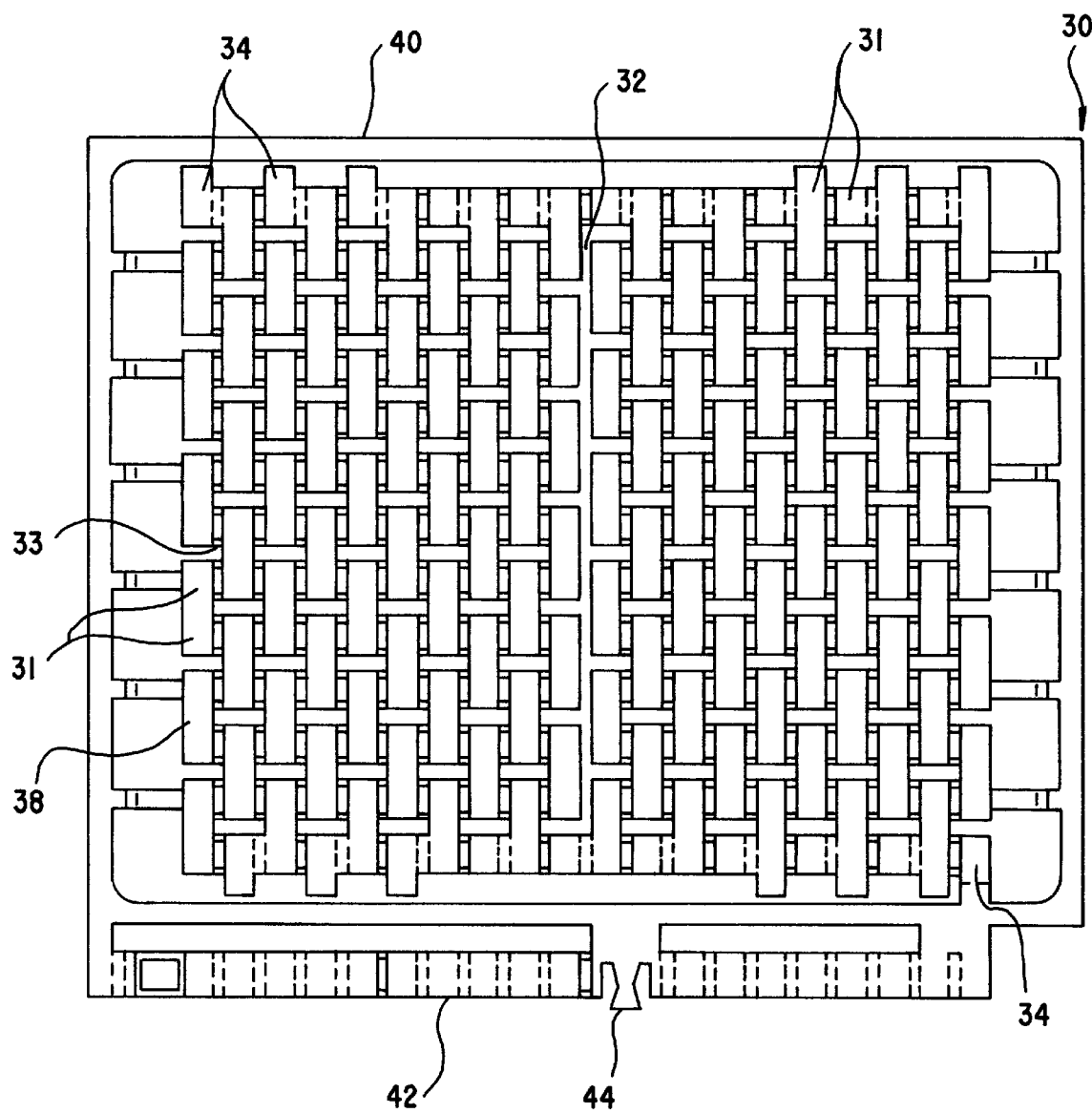
FIG. 6 is a bottom view of the first conductive plate.
Figure 7:
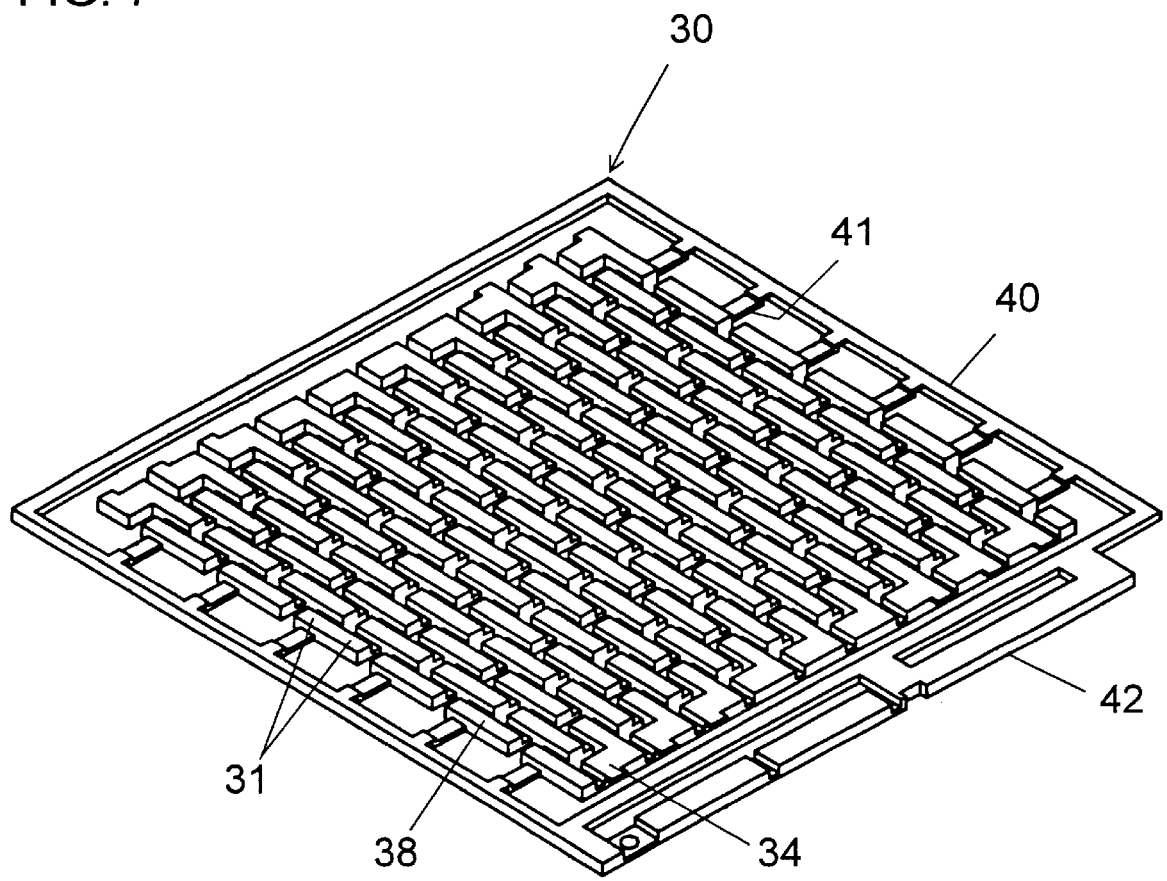
FIG. 7 is a perspective view illustrating the bottom of the first conductive plate.
Figure 12:
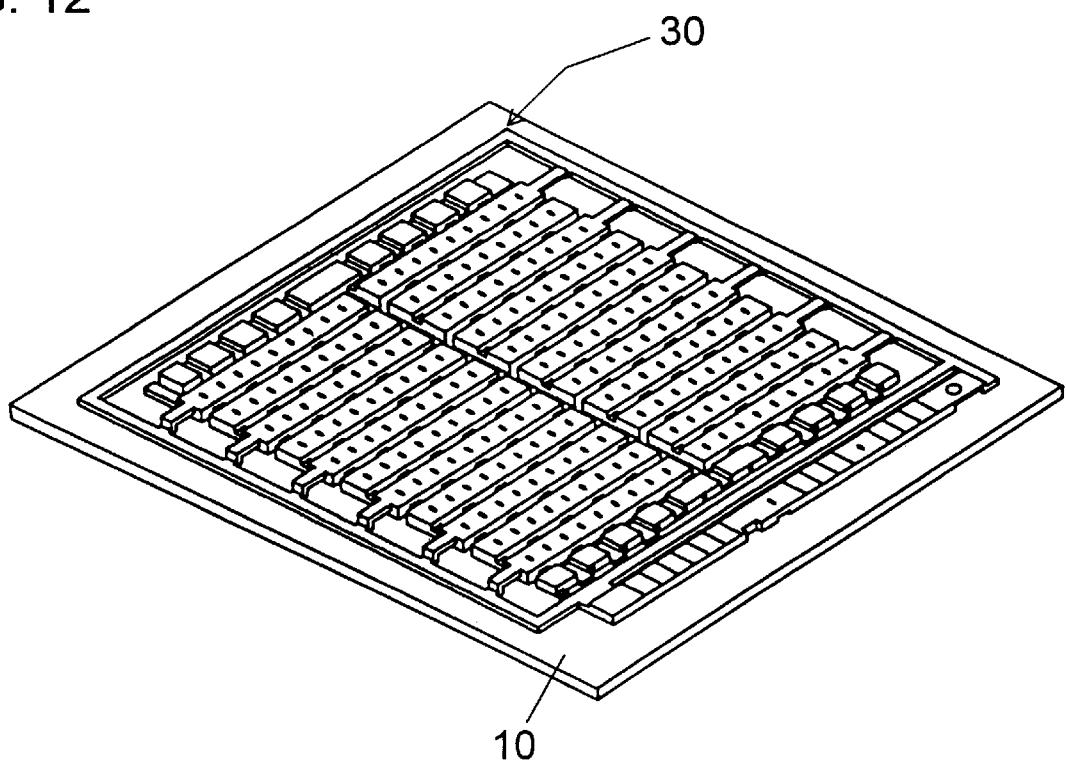
FIG. 12 is a perspective view of the first conductive plate bonded to a first substrate.

Fabrication of the thermoelectric module utilizes a first conductive plate 30 with the first contacts 31 and a second conductive plate 50 with the second contacts 51, in addition to the first and second substrates 10 and 20, and the thermoelectric bars 80. The first contacts 31 are integrally formed by etching the copper-made first conductive plate 30 to give a pattern of two matrices, as shown in FIGS. 4 and 5. Also by this etching, the first conductive plate 30 is formed with a rectangular frame 40 surrounding these matrices. The matrices are separated by a slit 32 at the center of the first conductive plate 30 and are connected to one another at the opposite ends of the slit 32. In each matrix, the first contacts 31 aligned along the row of the matrix are integrally interconnected by horizontal bridges 33, as shown in FIGS. 4 and 5, while the two adjacent first contacts 31 along the row of the matrix are integrally interconnected by a vertical bridge 38 at the bottom of the first conductive plate 30 in such a manner that pairs of the first contacts 31 are spaced from each other, as shown in FIGS. 6 and 7. The first contacts 31 of the opposite outermost rows are spaced by a pitch doubling that of the first contacts 31 of the intermediate rows, and are integrally interconnected by horizontal bridges 33 and extension bridges 34. The first contact 31 at one end of the column is connected to the first contact 31 at one end of the adjacent column by the extension bridge 34 so as to connect the column in series with the adjacent column. The two matrices are interconnected through the pair of the outermost rows.

As shown in FIG. 10, the horizontal bridge 33 is shaped into a thin configuration having a thickness half or less than that of the first contact 31 and having its top surface flush with the first contact 31 to leave a recess 35 therebehind. The horizontal bridges 33 of the intermediate rows are formed with holes 36, at which the horizontal bridges 33 are cut to separate the first contacts 31 in the direction of the row, as will be discussed later. As shown in FIGS. 8 and 9, the extension bridges 34 of the outermost row are shaped to have a thickness half or less than that of the first contact 31 and to have its bottom flush with the bottom of the first contact 31, to thereby form individual recesses 37 upwardly thereof.

As shown in FIG. 11, the vertical bridges 38 are also shaped to have a reduced thickness half or less than that of the first contact 31 and to have its bottom flush with the first contact to thereby form a recess 39 in its top for separating the two adjacent first contacts 31. The frame 40 is shaped to have reduced thickness of 0.3 mm or less and to have its bottom flush with the bottom of the first contacts 31. The frame 40 is connected to the matrices of the first contacts 31 through thin removable members 41 which extend from the top of the first contacts 31 and are to be removed for electrically and physically separating the matrices of the first contacts from the frame 40, as will be discussed later. The frame 40 is formed integrally with an apron 42 which extends in parallel with the row of the matrices and connected to the matrices of the first contacts 31 through a single lead 43. The apron 42 is formed with the electrical terminal 44 which is electrically connected to the first contacts 31 through the lead 43.

Several leads 43 may be provided for connecting the electrical terminal 44 to the first contacts 31 at one ends of different rows. By leaving only one lead while removing the others, it is made to vary the effective number of the chips arranged in the series circuit and thereby adjust the heating and cooling amount. Further, the apron 42 is formed with grooves 45 which are spaced by the same pitch as that of the first contacts 31 and serve as guide for cutting the horizontal bridges 33 together with the thermoelectric bars 80, as will be discussed later. As shown in FIG. 4, the apron 42 is connected to the frame 40 at the center electrical terminal 44 and at one end 46. A space formed by removal of the apron between the center terminal 44 and the end 46 is utilized for receiving a temperature sensor (not shown) for temperature control of the thermoelectric module.

Figure 23:
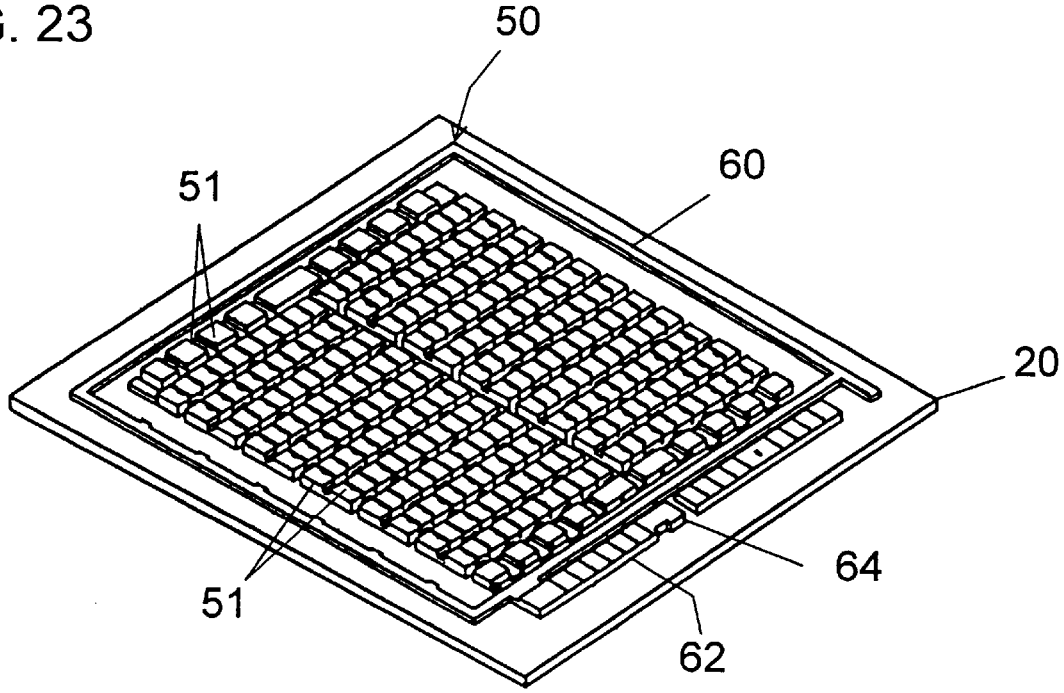
FIG. 23 is a perspective view of a second conductive plate utilized in the above module.

As shown in FIG. 23, the copper-made second conductive plate 50 is etched likewise to form matrices of the second contacts 51 together with a frame 60 and an apron 62. In this sense, the second conductive plate 50 is of the same configuration as the first conductive plate 30 to include a like electrical terminal 64 in the apron 62.

Instead of using the etching, the conducive plates may be made by other process such as a press-forming. In either case, Ni plating or Sn, An plating may be preferred to avoid oxidization or to improve soldering wetness.

The first and second substrates 10 and 20 are provided as ceramic substrates so that the first and second conductive plates 30 and 50 are bonded to the individual substrates by so-called DBC (Direct Bonding Copper) technique. During this bonding, the conductive plates are exposed to a high temperature of 1000° C. or more to lower the hardness. With this result, the thermoelectric bars can be supported rather gently on the plates so that it is expected to relieve stress applied to the thermoelectric chips. In order to avoid the occurrence of warp or distortion in the substrates and plates due to a difference in expansion coefficient between the copper-made plates and the ceramic substrates during the bonding at the high temperature, the conductive plates are formed to have stress-relief portions which are defined by the recesses 35 and holes 36 in the horizontal bridges 33, and recesses 39 in the vertical bridges 38. Instead of using the DBC technique, the conductive plates may be bonded to the substrates by, for example, welding. The substrates may be made of alumina, beryllia or other suitable ceramic, or even of a suitable plastic material.

Now explanation is made for the fabrication method of the thermoelectric module M. Firstly, the first and second conductive plates 10 and 20 are bonded respectively to the first and second substrates 30 and 50. With this bonding, the bottoms of the first contacts 31, the bottoms of the vertical bridges 38, the bottoms of the extension bridges 34, the bottom of the frame 40, and the bottom of the apron 42 are bonded to the first substrate 10, while the bottoms of the horizontal bridges 33 are spaced from the top of the first substrate 10, as shown in FIGS. 8 to 10. The same bonding is made to the second substrate 20.

Figure 13:
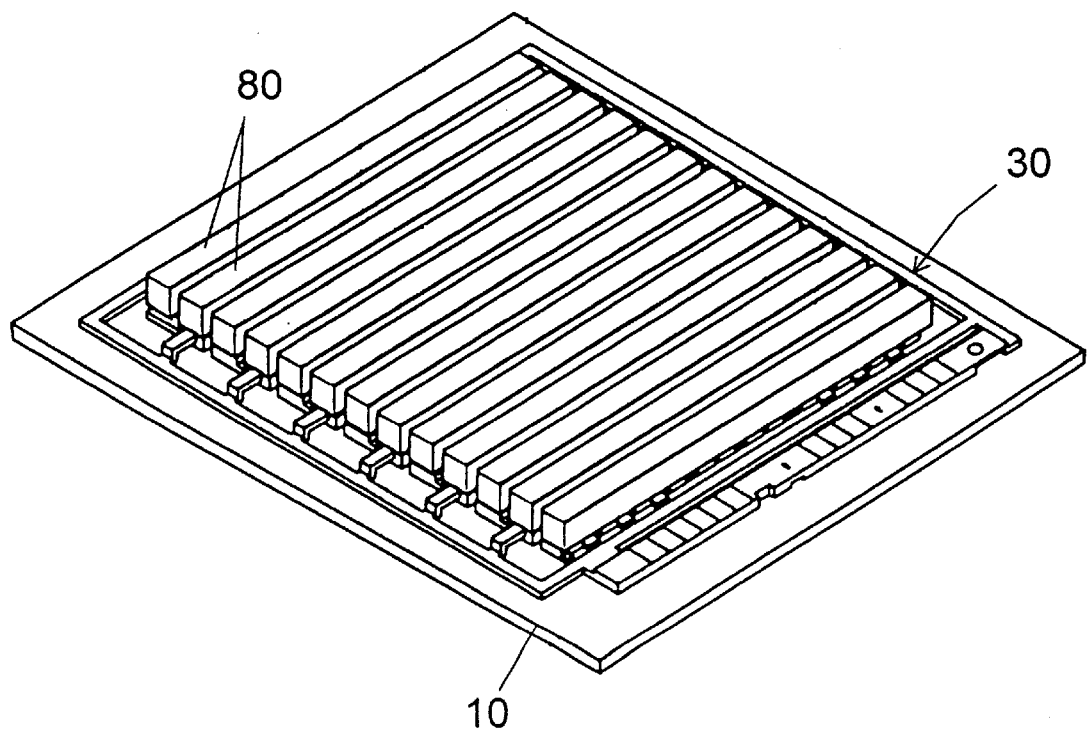
FIG. 13 is a perspective view of thermoelectric bars shown in a condition as bonded to the first conductive plate.

Next, as shown in FIG. 13, the thermoelectric bars 80 of the P-type and N-type are alternately arranged and bonded to the first contacts 31 of the first conductive plate 30. The bonding is made by soldering. For this purpose, the bonding faces of the thermoelectric bars 80 are coated with welding layers 81 made by plating or deposition, as shown in FIG. 17. The welding layer is selected to comprise one of Sn, Bi, Ag, Au, and Cu.

To place the thermoelectric bars 80 in positions on the first contacts 31, a jig 90 is employed as shown in FIG. 14. The jig comprises a lower guide 91 with slots 92 spaced by the same pitch as the first contacts 31 and an upper guide 93 with slots 94 space by a pitch doubles that of the first contacts 31. Upon registration of the slots 94 of the upper guide 93 with the slots 92 of the lower guide 91, the thermoelectric bars 80 of the P-type are placed in the slots 92 of the lower guide 91. Then, the upper guide 93 is slid to register the slots 94 with the remaining slots 92 for placing the thermoelectric bars 80 of N-type in the slots 92. Thus, the thermoelectric bars 80 can be held at a correct pitch on the first contacts without the risk of wrongly arranging the bars of P-type and N-type.

Instead of using the jig 90, the thermoelectric bars 80 may be integrated by a dielectric member into a unitary plate-like structure in which the bars are spaced evenly for direct bonding to the first contacts 31. Further, as shown in FIG. 15, the thermoelectric bars are integrated at their lengthwise ends by dielectric members 83 which are to be removed after cutting the thermoelectric bars into corresponding chips.

As shown in FIG. 16, the thermoelectric bar 80 is dimensioned to have a width X equal or slightly smaller than the width Y of the first contact 31. With this arrangement, the heat given off at the thermoelectric chip 1 can be transferred successfully through the first contact 31 to the first substrate 10 to minimize heat loss. If the chip width X should be greater than the contact width Y, heat fatigue would accumulate in a portion of the chip not contacted with the first contact to result in the fracture of the chip. The thermoelectric bars of P-type and N-type may not necessarily have the same width.

The thermoelectric bar 80 inherently includes cleavage planes 82. When obtaining the thermoelectric bar 80 from a bulk, it is made, as shown in FIG. 17, to cut the bulk in such a manner as to orient the cleavage planes 82 in the longitudinal direction of the thermoelectric bar 80, in order that, as discussed later, the thermoelectric bar 80 is subsequently cut into the thermoelectric chips 1 along lines of cut which are not in parallel with the cleavage planes 82. Since the thermoelectric bar 80 is brittle, it is very likely to suffer from fracture or crack when cut in parallel with cleavage planes 82, reducing a yield. The thermoelectric bar 80 is bonded to the first and second electrodes 31 and 51 on its top and bottom which are generally perpendicular to the cleavage planes. Thus, the thermoelectric chips 1 cut from the thermoelectric bar have the cleavage planes which are arranged in a direction along which expansion and contraction are caused due to temperature difference developed between the one surface being heated and the other surface being cooled when supplying the current to the thermoelectric module. When operating the thermoelectric module, the expansion and contraction forces will act in a direction along which the thermoelectric chips 1 of P-type and N-type are arranged alternately. However, because of that the cleavage planes 82 are arranged in that direction, the cleavage planes can displace at a minute extent to absorb the stress due to the expansion and contraction, thereby giving a large allowable range of displacement due to the expansion and contraction and therefore protecting the chips from being fractured by the stress.

Figure 19:
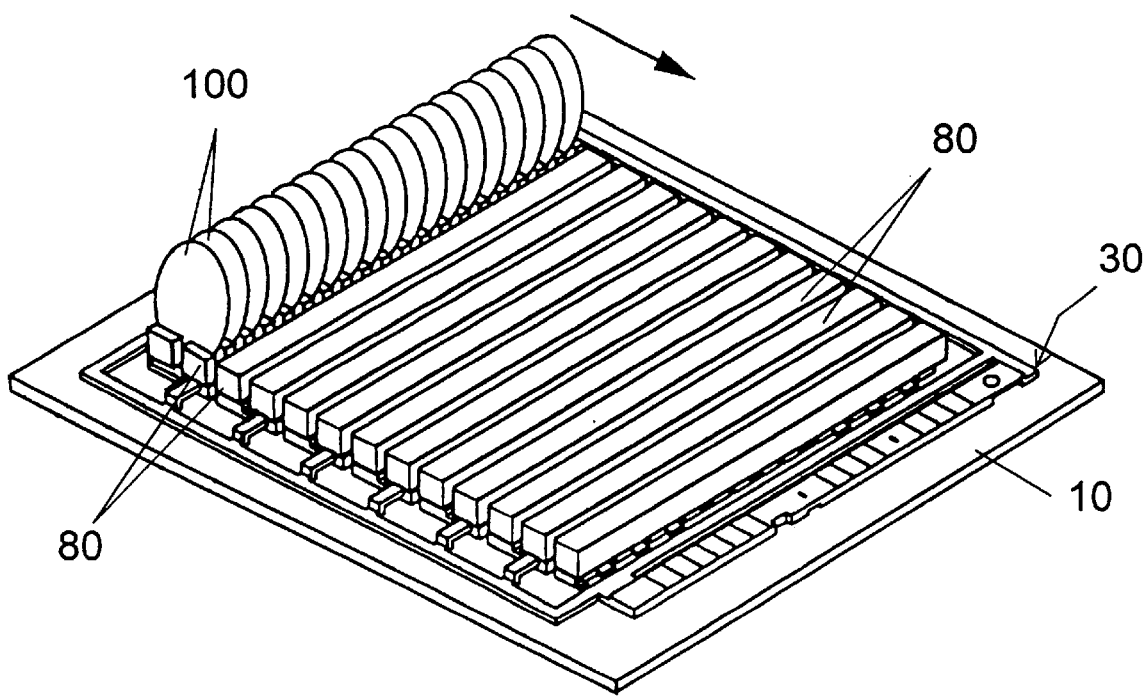
FIG. 19 is a perspective view illustrating a manner of cutting the thermoelectric bars.
Figure 20:
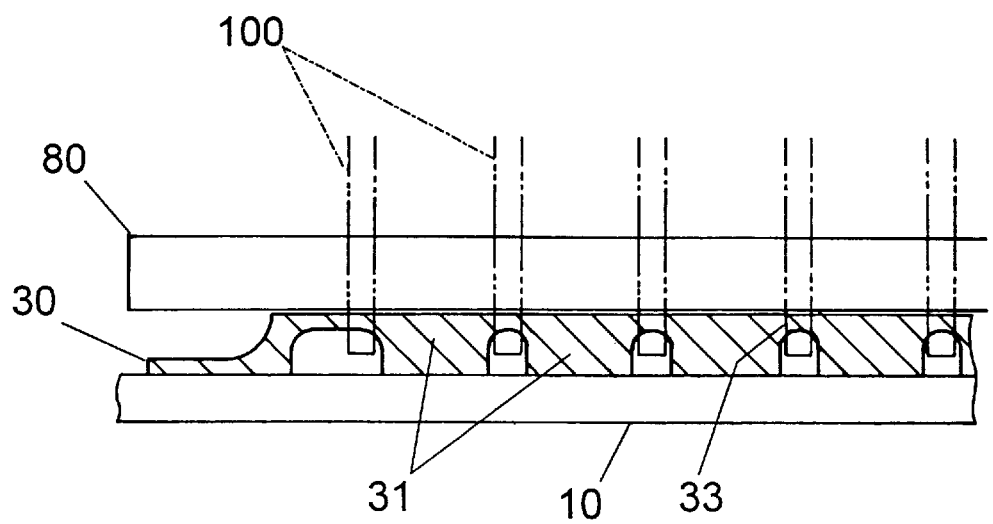
FIG. 20 is a sectional view illustrating the cutting of the thermoelectric bar.

After being bonded to the first substrate 10, the thermoelectric bar 80 is cut, as shown in FIGS. 19 and 20, by use of whetstones (dicing saw) 100. Since all the thermoelectric bars 80 are bonded to the first contacts 31 of straight configurations, they can be cut simultaneously into the resulting thermoelectric chips 1 which are left separately on the associated first contacts 31. Thus, the cutting is made easily. In addition, the plural dicing saws are driven to move simultaneously for reducing the cutting time. The cutting is made in the direction generally perpendicular to the cleavage planes so that the resulting chips are prevented from being fractured. As shown in FIG. 20, the cutting is also made simultaneously to the horizontal bridges 38 connecting the first contacts 31 as well as to the removable members 41 connecting the opposite first contacts 31 at the ends of the row to the frame 40, thereby forming the thermoelectric chips 1 on the individual first contacts 31 arranged along the row and separating the first contacts 31 from each other. Thus, the matrix of the first contacts 31 are separated from the frame 40. Since horizontal bridges 33 and the removable members 41 are spaced from the first substrate 10, the cutting is made without causing interference between the saws and the first substrate. Further, since the frame 40 and the extension bridges 34 are made thin and bonded to the first substrate 10, they could not be cut by mistake.

Figure 21:
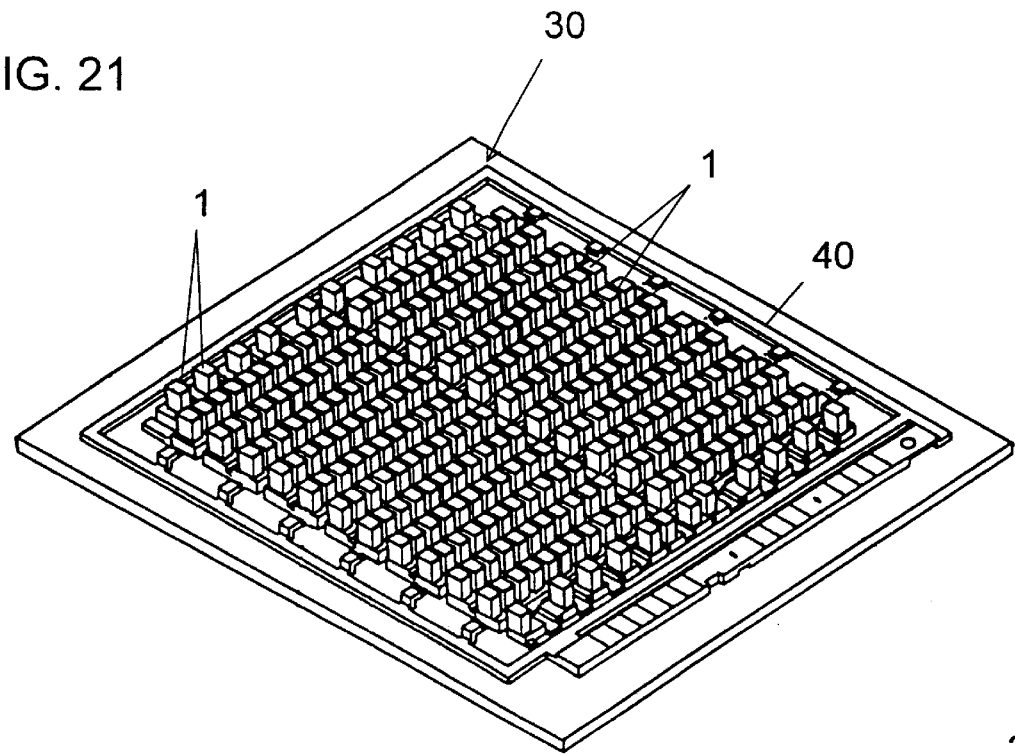
FIG. 21 is a perspective view of the thermoelectric chips cut from the thermoelectric bars.
Figure 22:
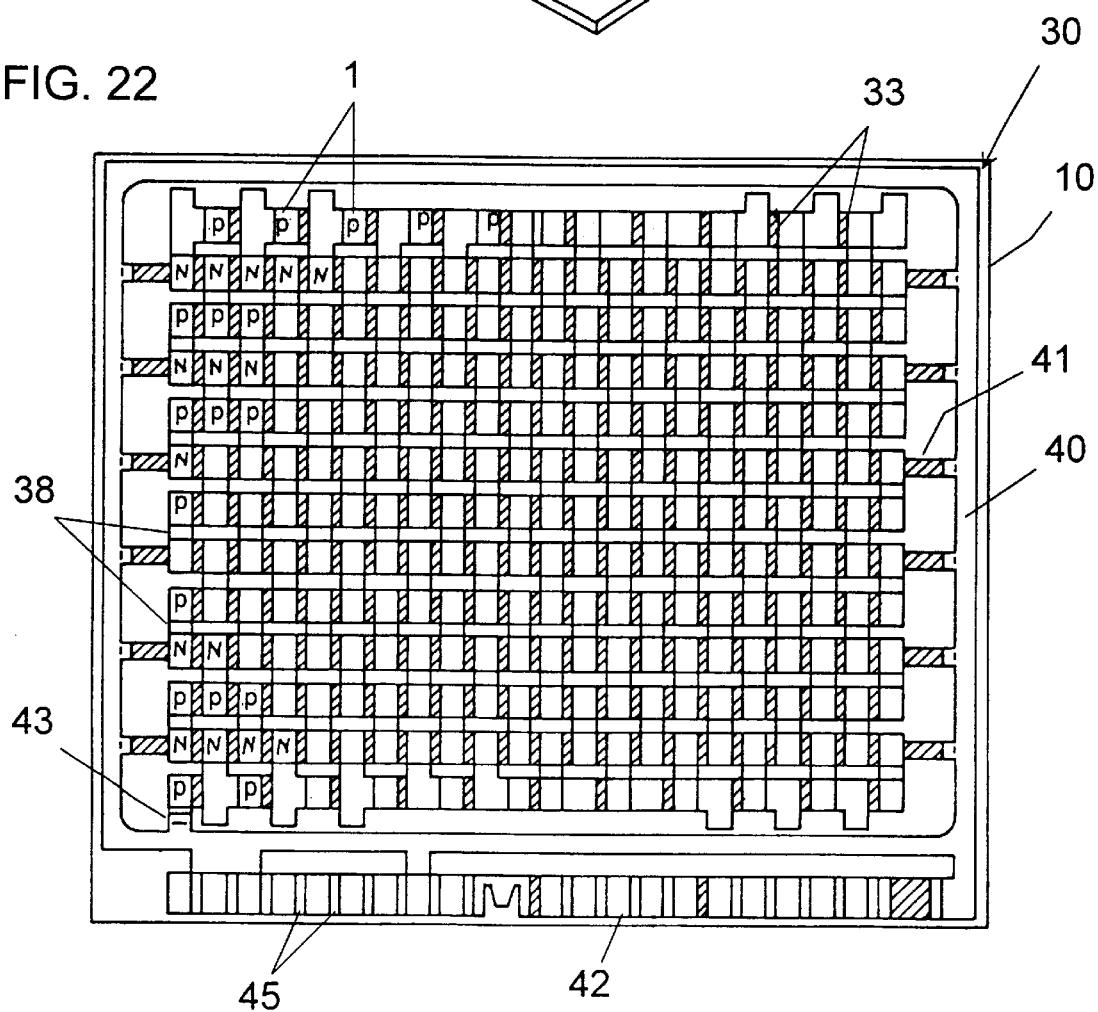
FIG. 22 is a plan view of the thermoelectric chips cut from the thermoelectric bars.

FIG. 21 illustrates the individual thermoelectric chips 1 formed on the first contacts 31 thus separated in the row direction. The first conductive plate 30 is cut out at portions indicated by hatching lines in FIG. 22. Because of that the outermost thermoelectric bars 80 are not bonded at portions thereof to the corresponding extension bridges 34, the thermoelectric chips 1 cut at these portions are removed so that the chips at the outermost rows are spaced by a pitch doubles that of the chips at the intermediate rows. The removable members 41 are simultaneously cut to separate the matrix of the first contacts from the frame 40. The grooves 45 in the apron 42 have a depth equal to the thickness of the horizontal bridge 38 and are utilized to guide therethrough the saws 100 for cutting the horizontal bridges 38. Laser or highly pressurized water jet may be employed instead of the saws 100 for the cutting.

The second conductive plate 50 is bonded to the second substrate 20 in the same manner as the first conductive plate 30. As shown in FIGS. 23, the second contacts 51 are separated at the horizontal bridges in the row direction and separated from the frame 60.

Figure 24:
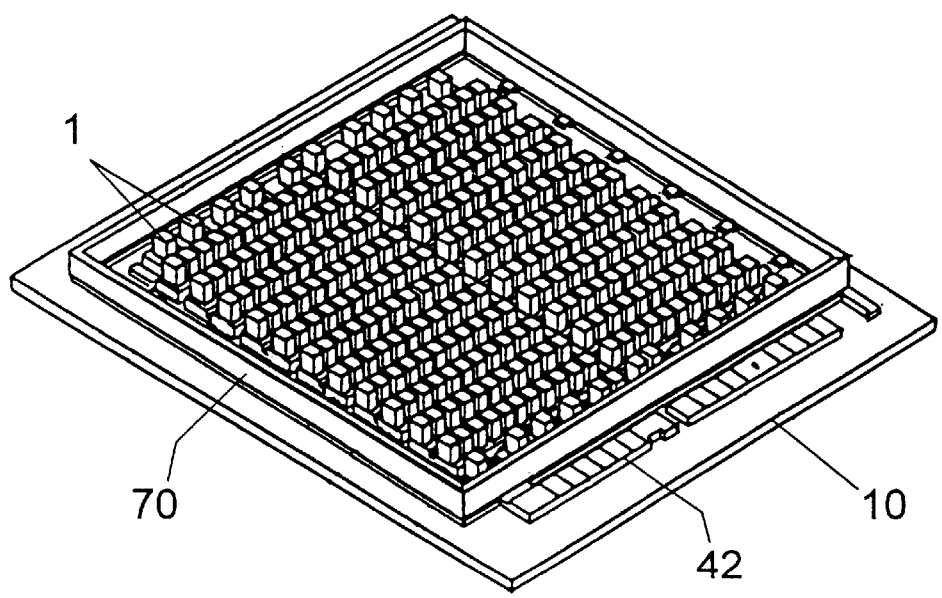
FIG. 24 is a perspective view of a sealing enclosure shown in its assembled condition.
Figure 25:
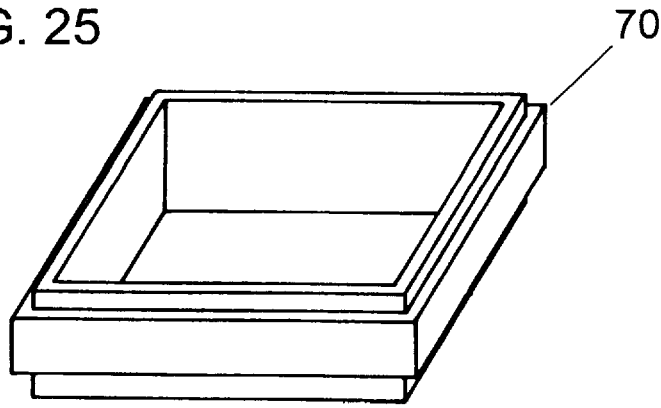
FIG. 25 is a perspective view of the sealing enclosure.
Figure 26:
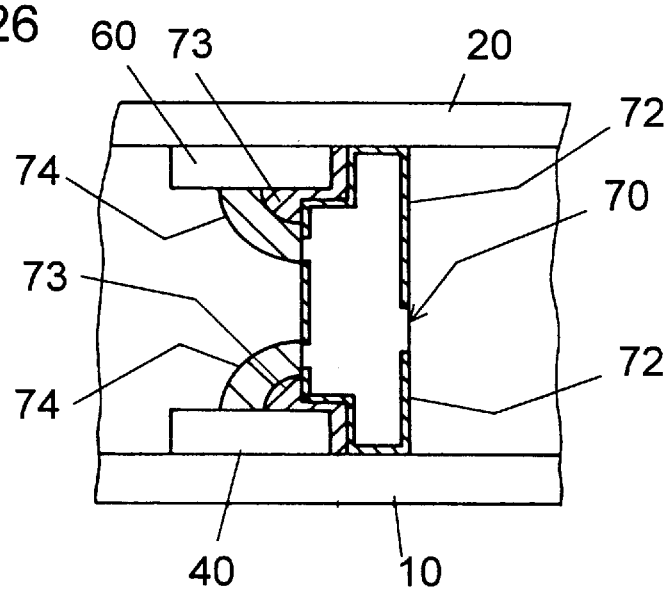
FIG. 26 is an enlarged section illustrating a fixing portion of the sealing enclosure.

When bonding the second substrate 20 to the first substrate 10, a rectangular sealing enclosure 70 is placed between first and second substrates to seal the matrix of the thermoelectric chips 1 therein, as shown in FIGS. 24 and 25. The sealing enclosure 70 is bonded at its top and bottom to the frames 40 and 60 of the first and second conductive plates 30 and 50. The sealing enclosure 70 comprises a plastic framework formed thereon with a metal layer 72 of a copper, nickel or tin deposited by plating or spraying, and is secured to the frames 40 and 60 by a solder 73 to prevent the entry of moisture more successfully than using an adhesive. As shown in FIG. 26, the sealing enclosure 70 is of a cross-section having a section which is in direct contact with the first and second substrates inwardly of the frames 40 and 60 in order to hold the first and second substrates at an accurate distance. The soldering portions can be viewed from outside to be easily checked. An adhesive is additionally employed to prevent the entry of moisture through portions not provided with the metal layer 73 and also prevent a possible crack occurring in the fatigued solder 73.

The sealing enclosure 70 is constructed to bear loads applied to the first and second substrates 10 and 20.

Figure 27:
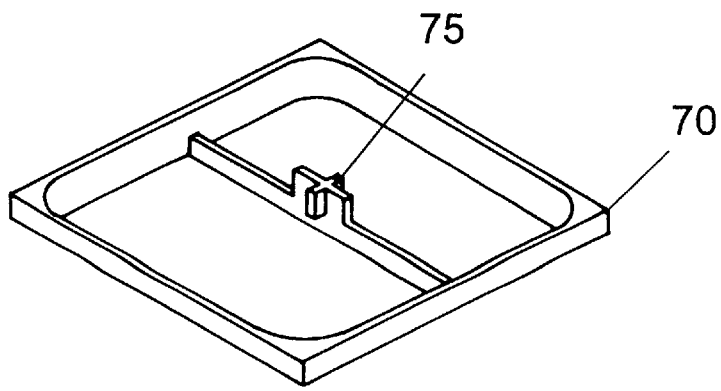
FIG. 27 is a perspective view of another sealing enclosure.

The bonding of the sealing enclosure 70 to the second substrate 20 is made simultaneously with the bonding of the thermoelectric chips 1 to the second contacts 51 on the second substrate 20. Thus, the distance between the substrates can be determined by the sealing enclosure 70, while any variation in the height of the thermoelectric chips 1 can be absorbed by the thickness of the solder used for connection of the chips to the second contacts 51. The load applied to the substrates can be shared by the rigidity of the sealing enclosure 70 and by that of the chips, enabling to reduce the load applied directly to the chips. As shown in FIG. 27, the sealing enclosure 70 is preferred to have thick corners or to provide a center post 75 for bearing the load.

In the thermoelectric module thus fabricated, all the thermoelectric chips 1 are electrically connected in series through the first and second contacts 31 and 51, vertical bridges 38 and extension bridges 34 bonded to the first and second substrates 10 and 30 to give a series circuit which is connected to an electric source through the terminals 44 and 64. In the first and second conductive plates, the chips at the uppermost and lowermost rows are spaced by the double pitch for reasons of employing the first and second conductive plates of the same configuration and avoiding the series connection of the two adjacent chips of the same type. However, the two chips at the center of the lowermost row have to be connected in series. Such connection of the chips of the same type will lower the efficiency to some extent. But, this arrangement is inevitable to employ the conductive plates of the same pattern with the odd numbers of the rows and to provide two matrices of the contacts with the provision of the slit 32 in the conductive plates for relieving thermal stress.

The chips are arranged in the odd rows in order to locate the chips of the same type at the outermost rows. As discussed previously, the portions of the thermoelectric bar at the opposite ends of the outermost rows are removed. Thus, the same type of the thermoelectric material are discarded thereat can be easily recycled. In this connection, it is preferred to place the thermoelectric bars of P-type at the outermost rows since the P-type is easy to obtain a desired characteristic in addition to being made at a low cost.

Figure 28:
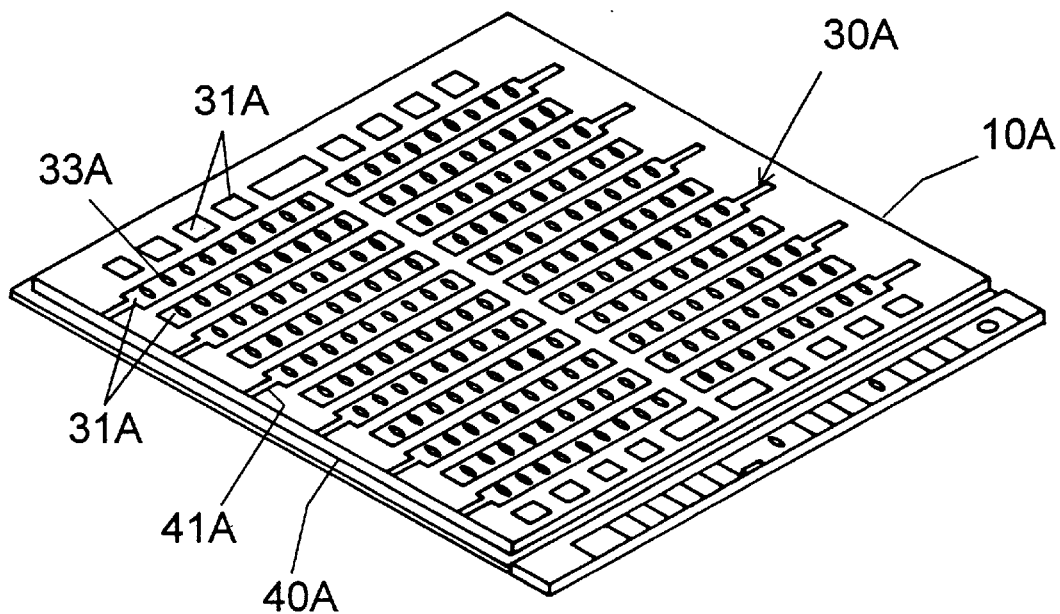
FIG. 28 is a perspective view of another conductive plate which may be utilized in the above thermoelectric module.
Figure 29:
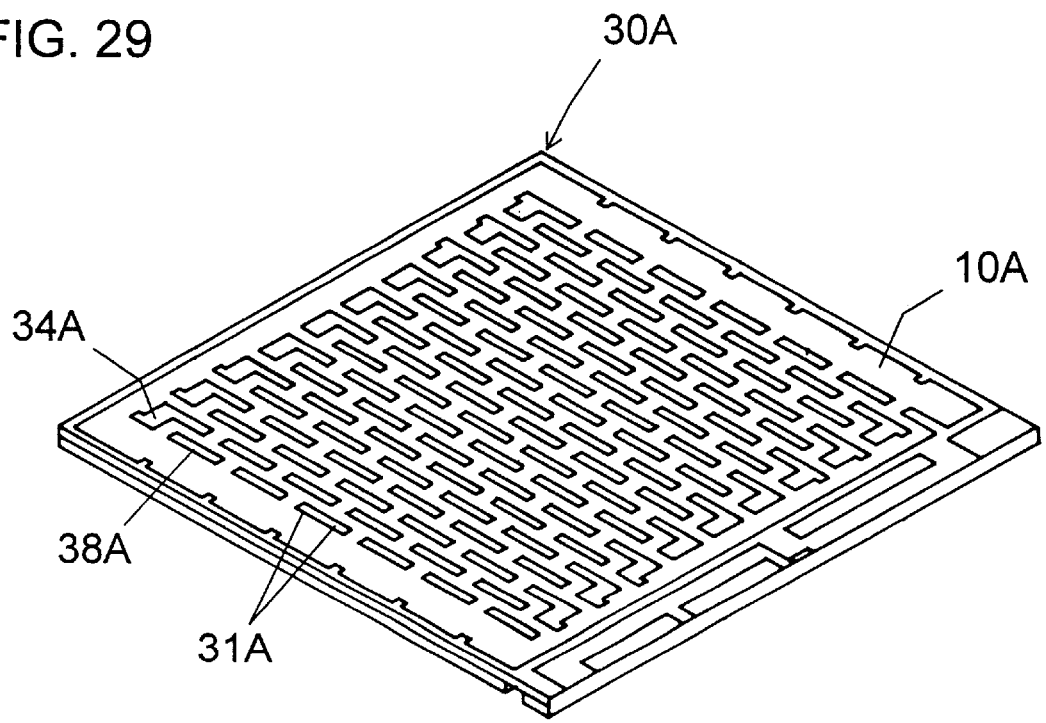
FIG. 29 is a perspective view illustrating the back of the above conductive plate.

A dielectric plastic substrate may be employed instead of the ceramic substrate. FIGS. 28 and 29 show the conductive plates 30A of the same configuration as above which is molded in the dielectric plastic by a injection molding, for instance, to support the conducive plate in the plastic substrate 10A. In this molding, the contacts 31A are exposed to the upper and lower surfaces of the substrate 10A, and the removable members 41A connecting a frame 40A to the contacts 31A can be removed by cutting away the upper surfaces around the periphery of the substrate 10A, as shown in FIG. 28 When molding in the conductive plate 30A into the substrate 10A, it is preferred to oxidize the surface of the conductive plate, then to remove the resulting oxidized layer at the individual contacts to which the thermoelectric bars are bonded, and to process the surfaces of the contacts with nickel. With the use of the plastic molded substrate, the sealing enclosure may be integrally molded therewith.

The plastic substrate 10A may have its bottom flush or concave with respect to the bottom of the contacts 31A in order to bring the contacts 31A, vertical bridges 38A, and extension bridges 34A into direct contact with heat radiating and/or absorbing member for improving heat radiating and absorbing characteristics. The plastic substrate 10A is found to have good heat radiating characteristic as compared to the ceramic substrate, it is preferred to use the plastic substrate for the heating radiating side and the ceramic substrate for the cooling side. As a matter of course, the plastic substrates may be employed for either of the heating and cooling side.

The upper surface of the plastic substrate 10A is preferred to be made slightly higher than the top of the contacts 31A for avoiding electrical shorting between the contacts of the adjacent rows at the time of soldering the thermoelectric bars or chips to the contacts. When cutting the thermoelectric bars and the horizontal bridges 33A of the conductive plate 30A, corresponding portions of the substrate 10A are cut off.

The plastic substrate 10A is molded to have an equal exposure ratio of the exposed metal portions to the substrate at the upper and the lower surfaces of the substrate so as to minimize occurrence of a warp. An epoxy resin particularly added with $SiO_2$ is a suitable plastic material.

Figure 32:
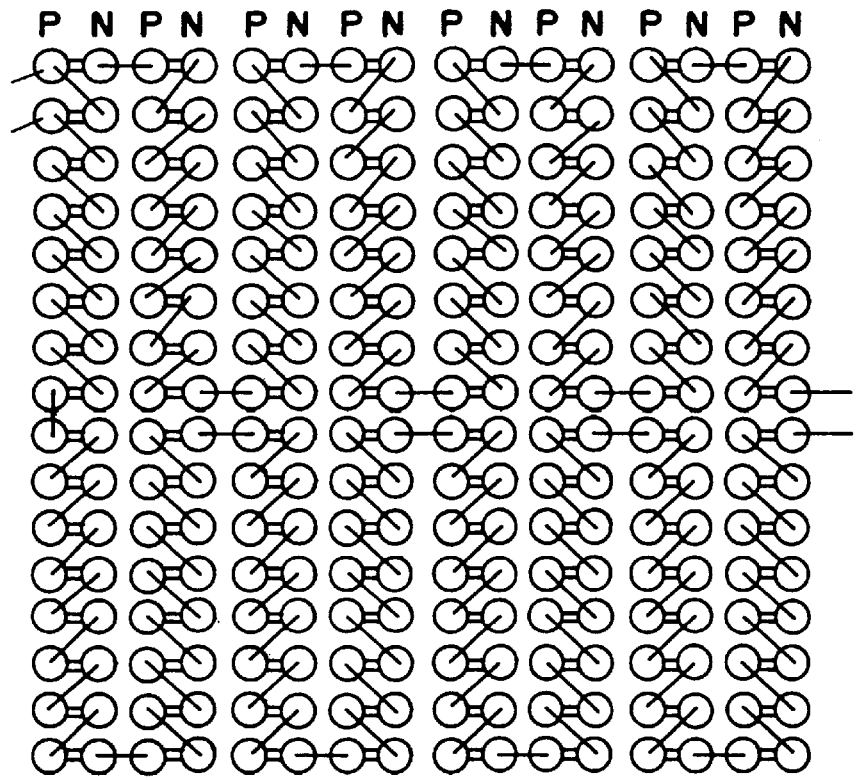
FIG. 32 is a schematic view illustrating a further series circuit of the thermoelectric chips adapted to the above thermoelectric module.

In the above embodiments, the plural thermoelectric chips 1 are connected in series in a pattern as shown in FIG. 30A. However, various other patterns are available, as shown in FIGS. 31A to 31F and FIG. 32. In FIG. 32, single lines indicate the connection between the contacts on the side of one substrate, while double lines indicate the connections on the side of the other substrate.

Figure 33:
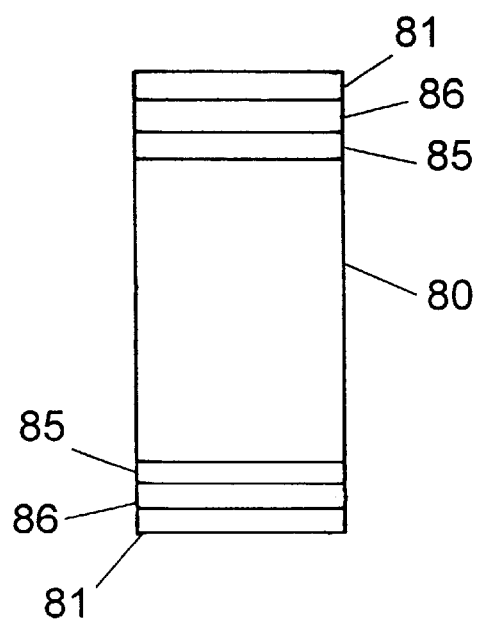
FIG. 33 is a sectional view of the thermoelectric chip.

The thermoelectric bars 80 and chips 1 are bonded to the contacts by soldering. In this respect, the chips 1 is preferably formed as a diffusion preventive barrier with a Mo layer 85 and Ni layer 86, as shown in FIG. 33. Further, as shown in FIG. 33, the Ni layer 86 may be coated with a layer 81 of a material at leaset one selected from a group consisting of Sn, Bi, Ag, and Au, for example, Sn+Bi layer. The Sn+Bi layer 81 is selected to prevent oxidization of the Ni layer 86 as well as to enhance soldering efficiency. Preferably, the Ni layer 86 has a thickness of 1 $\mu$m or more, Mo layer 85 has a thickness less than the Ni layer. For example, Mo layer 85 is 0.2$\mu$, Ni layer 86 is 2 $\mu$m, and Si+Bi layer 81 is 2 $\mu$m in thickness.

Figure 34:
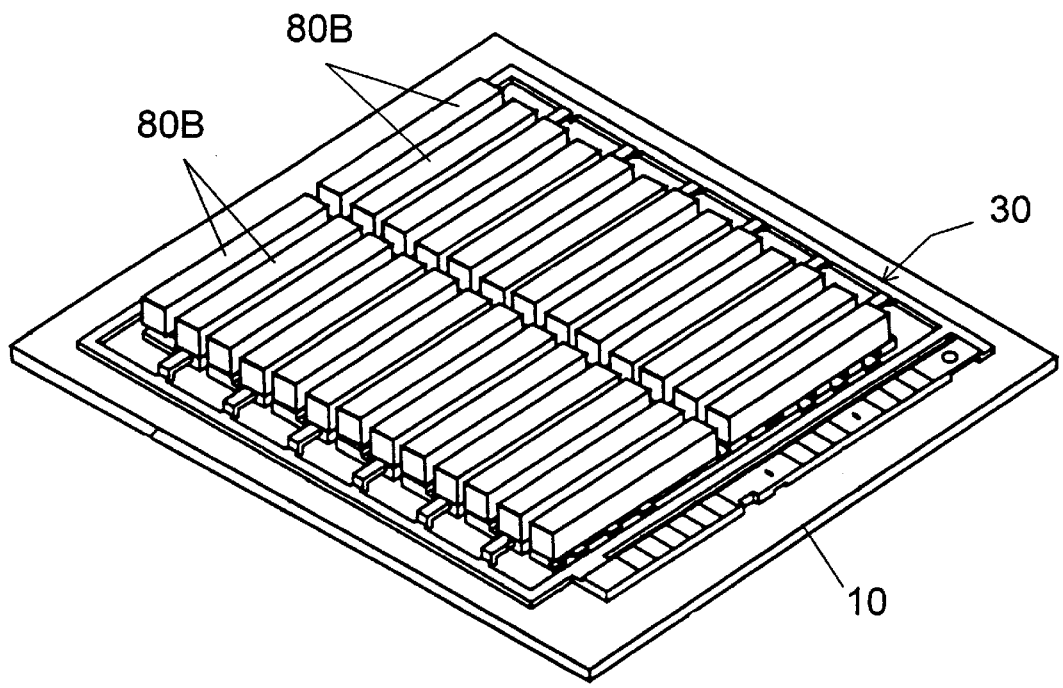
FIG. 34 is a perspective view illustrating another example of bonding the thermoelectric bars to the first conductive plate.

As shown in FIG. 34, it may be possible to use two thermoelectric bars 80B for each row of the contacts to reduce a stress that the bars receive due to possible warp developed in the substrate after bonding the bars 80B to the contacts.

Figure 35:
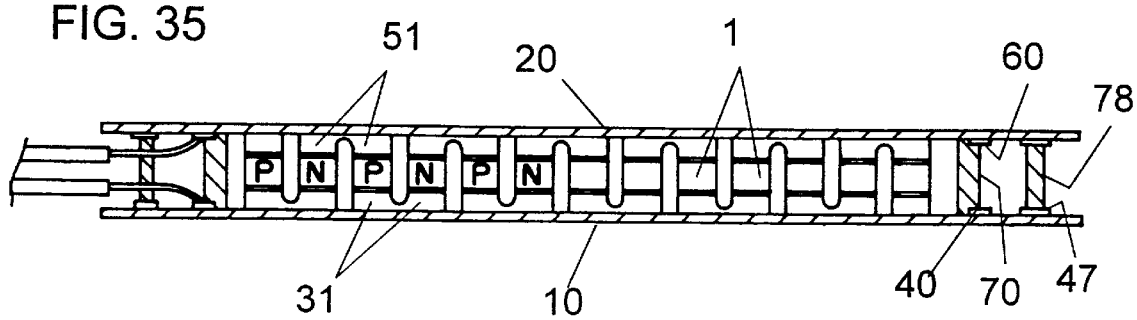
FIG. 35 is a longitudinal section illustrating a thermoelectric module in accordance with another embodiment of the present invention.
Figure 36:
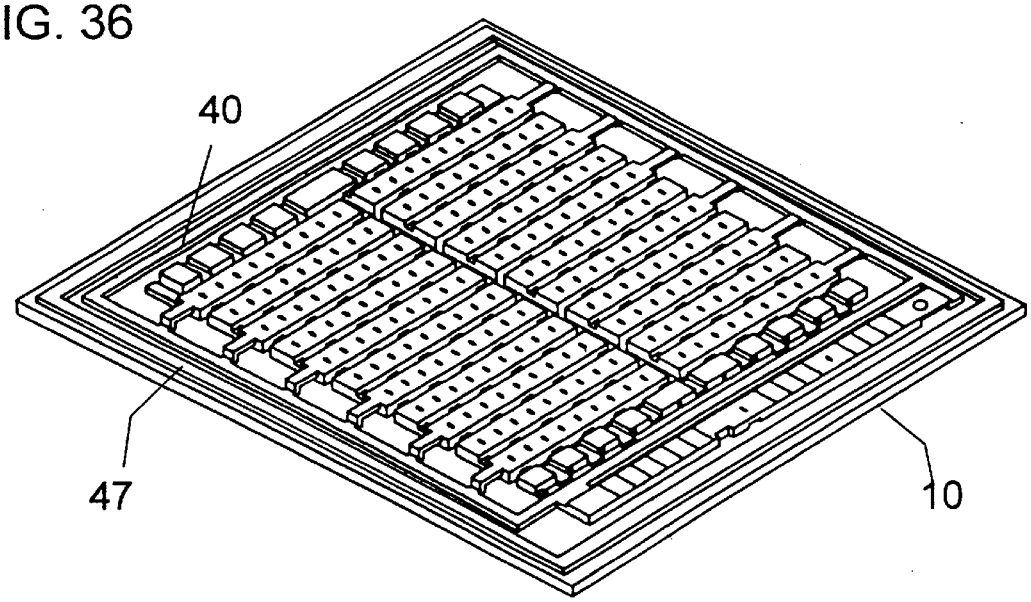
FIG. 36 is a perspective view of the first conductive plate utilized in the above module.

In order to further reduce the load applied to the thermoelectric chips 1, a reinforcing fixture 78 may be provided around the sealing enclosure 70, as shown in FIG. 35. In this case, a metal ring 47 is provided outwardly of the frame 40, as shown in FIG. 36, and is secured to the reinforcing fixture 78. The reinforcing fixture 78 may be soldered to the ring 47 likewise as the sealing enclosure 70, or may be secured thereto by an adhesive.

Figure 37:
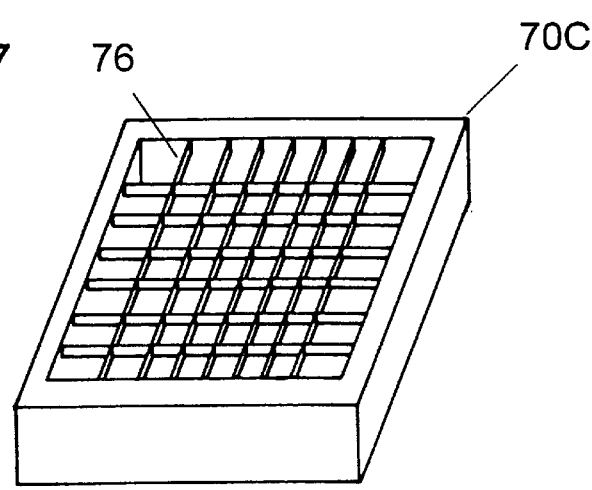
FIGS. 37 and 38 are perspective and sectional views respectively of a sealing enclosure utilized in the above module.
Figure 38:
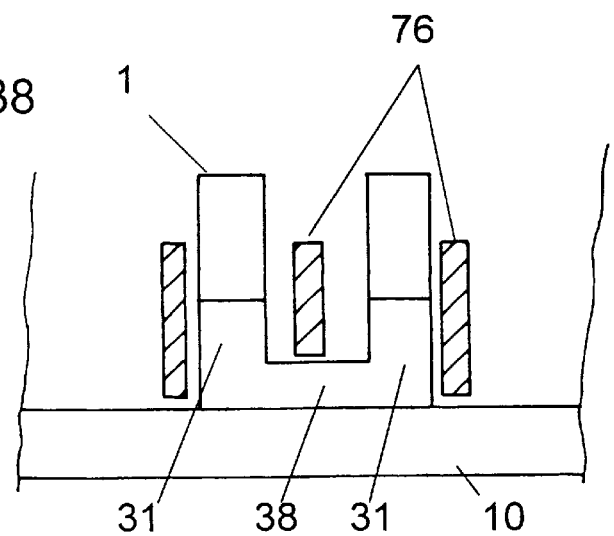

FIGS. 37 and 38 show another sealing enclosure 70C which may be utilized in the thermoelectric module. The sealing enclosure 70C includes partitions 76 for keeping electrical insulation between the thermoelectric chips 1 by bonding the one faces of the chips 1 to the second contacts 51 of the second substrate 20 while separating the chips by the partitions 76, as shown in FIG. 38, thereby avoiding the shorting through the solder at the time of bonding the chips to the substrate.

Figure 39:
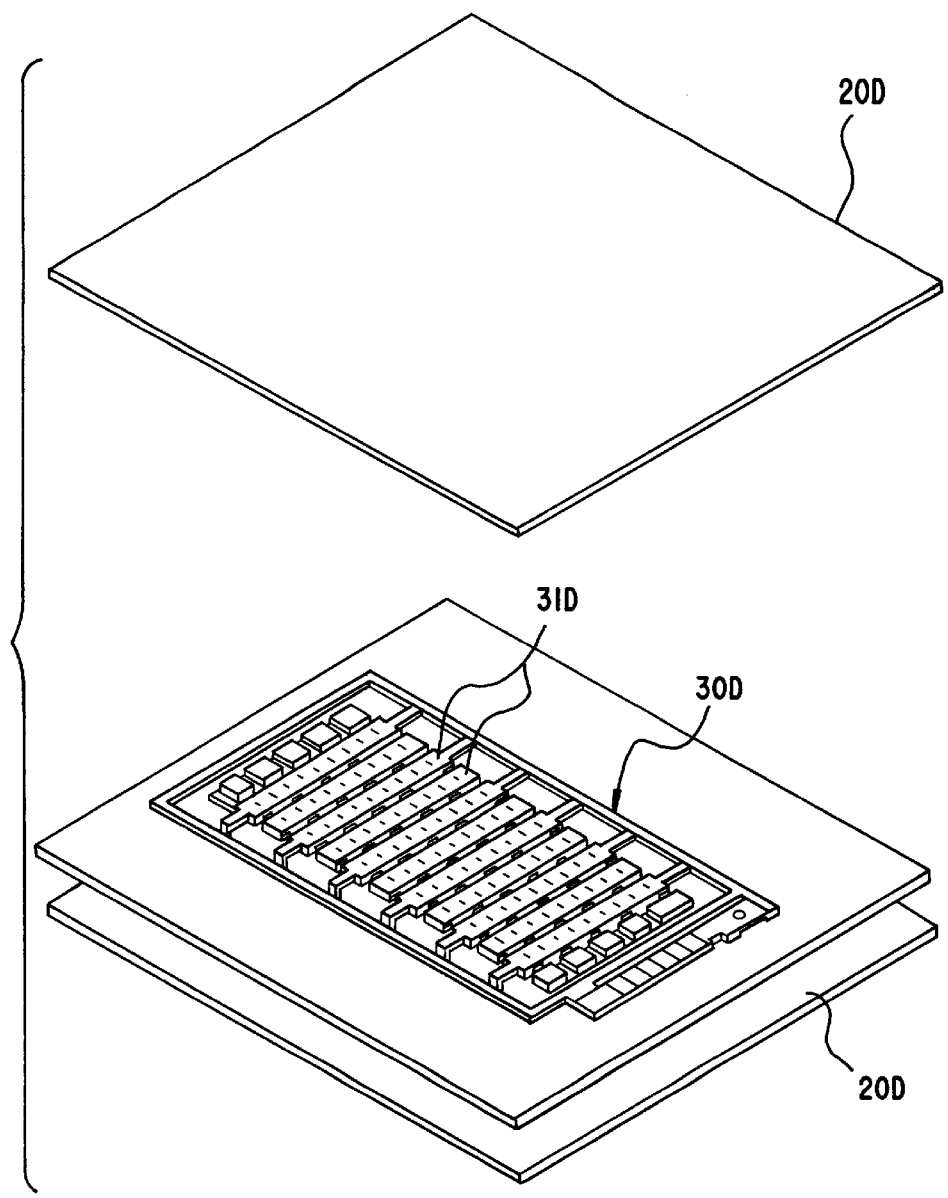
FIG. 39 is an exploded perspective view of a thermoelectric module in accordance with a further embodiment of he present invention.
Figure 40:
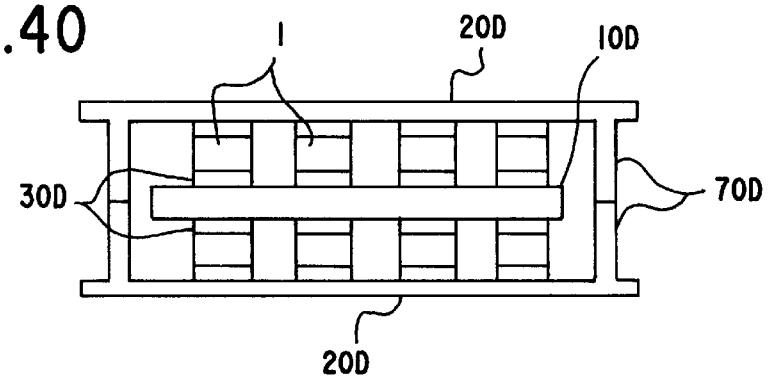
FIG. 40 is a sectional view of the above module.
Figure 41:
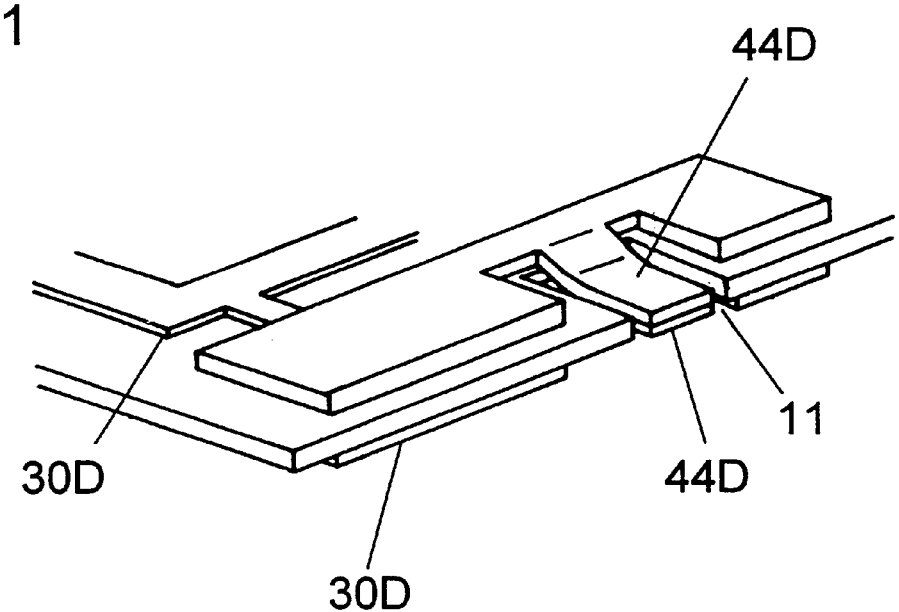
FIG. 41 is a partial perspective view of a portion where circuits on opposite surfaces of the first substrate is connected.
Figure 42:
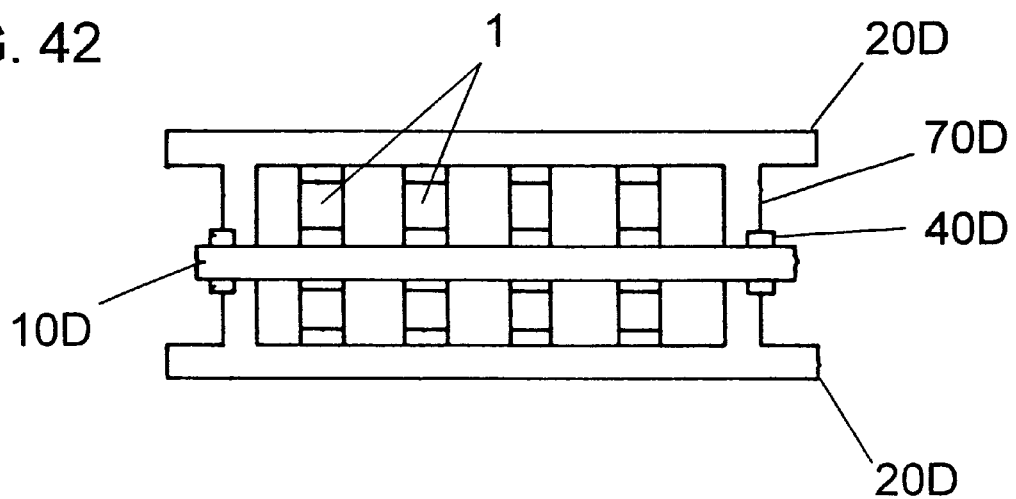
FIG. 42 is a sectional view illustrating a modification of the above thermoelectric module.

FIGS. 39 to 41 show an embodiment in which the first substrate 10D is provided on its opposite surface respectively with matrices of the thermoelectric chips. In the like manner as in the previous embodiment, the first conductive plates 30D are bonded to the opposite surfaces of the first substrate 10D, and the thermoelectric chips 1 are formed on the first contacts 31D of each conductive plate 30D. The second contacts 51D of the second substrate 20D are bonded to the matrices of the chips 1 to complete the thermoelectric module. Series electric circuits of the chips 1 formed respectively on the opposite surfaces of the first substrate 10D are interconnected by directly connecting electrical terminals 44D, formed integrally in the first conductive plates 30D, through notches 11 formed in the ends of the substrate 10D, as shown in FIG. 41. The second substrate 20D is made of a dielectric plastic material molded integrally with a sealing enclosure 70D. As shown in FIG. 40, the second substrates 20D are interconnected with the individual sealing enclosures 70D held in abutment against one another. As shown in FIG. 42, the first substrate 10D may be held between the opposed sealing enclosures 70D in which case the sealing enclosures 70D are bonded at their outer peripheries to the frames 40D of the first substrate 10D.

We claim:

1. A method of fabricating a thermoelectric module, said module composed of a plurality of thermoelectric chips arranged in a matrix between first and second dielectric substrates and electrically connected in series to each other so as to heat the side of the first substrate and cool the side of the second substrate due to the Peltier effect obtained in the thermoelectric chips, said method using a plurality of elongated thermoelectric bar of P-type and N-type to be separated into said thermoelectric chips and a first conductive plate carrying a plurality of first contacts arranged in a matrix, the adjacent ones of said first contacts arranged in a row of the matrix are interconnected respectively by horizontal bridges, while said first contacts are spaced along a column of the matrix;

said method comprising the steps of:
integrating said first conductive plate to said first substrate to support the first conductive plate by said first substrate;
placing a plurality of said elongated thermoelectric bars of P-type and N-type on said first contacts along said rows in such a manner that P-type bars alternate the N-type bars in a spaced relation along said column of the matrix;
bonding each elongated thermoelectric bar on its one face to said first contacts arranged in the row;
cutting each elongated thermoelectric bar into said thermoelectric chips as well as cutting said horizontal bridges simultaneously to allocate the resulting thermoelectric chips on the individual first contacts;
placing a plurality of second contacts on said chips opposite of the first contacts to form a series electric circuit of said chips in combination with said first contacts, and bonding the second substrate supporting said second contacts to said first substrate for connection therebetween.

2. The method as set forth in claim 1, wherein said first substrate is made of a ceramic material on which said first conductive plate supported.

3. The method as set forth in claim 2, wherein the plurality of said thermoelectric bars are integrated into a unitary structure by a dielectric material before being placed on said first contacts.

4. The method as set forth in claim 2, wherein said horizontal bridges when placed on said first substrate are kept spaced from the opposite surface of said first substrate to leave an open space thereat.

5. The method as set forth in claim 2, said first substrate is made of alumina and said first conductive plate is made of a copper or copper alloy to have said first contacts and said horizontal bridges as integral parts thereof, said first conductive plate being bonded to said first substrate by the direct bonding copper (DBC) technique.

6. The method as set forth in claim 5, wherein said first conductive plate is of a unitary structure including a frame surrounding the matrix of the first contacts and integrally connected thereto, said frame in addition to said first contacts being directly bonded to said first substrate.

7. The method as set forth in claim 6, wherein said frame has a thickness less than said first contacts.

8. The method as set forth in claim 5, wherein said horizontal bridge is formed with a recess for absorbing heat stress applied to the first conductive plate when said first conductive plate is bonded to the first substrate.

9. The method as set forth in claim 2, wherein said first conductive plate is bonded to each of opposite surfaces of said first substrate in order that the matrix of said thermoelectric chips are formed on the first contacts of each said first conductive plate for providing two series circuits of said thermoelectric chips, said first conductive plates on opposite surfaces of the first substrate having individual expansion terminals disposed at one end of the first substrate in a closely adjacent relation to each other such that the two series circuits are interconnected at said expansion terminals.

10. The method as set forth in claim 9, wherein the second contacts are bonded to the thermoelectric chips on the first contacts on each of the opposite surfaces of said first substrate of the ceramic material, said second contacts being molded in the second substrate of the dielectric plastic material.

11. The method as set forth in claim 10, wherein each of said second substrates of the dielectric plastic material is molded to integrally include a sealing enclosure surrounding the circuit of the thermoelectric chips on said first substrate, said sealing enclosure being held between the first substrate and each of the second substrates in such a manner as to secure the circumference of the first substrate between the opposed sealing enclosures.

12. The method as set forth in claim 2, wherein the second contacts are formed as integral parts of a second conductive plate which is molded in the second substrate of a dielectric plastic material.

13. The method as set forth in claim 1, wherein said first substrate is made of a dielectric plastic material into which said first conductive plate is molded with said first contacts exposed on one surface of said first substrate.

14. The method as set forth in claim 13, wherein said first conductive plate is of a unitary structure having the matrix of the first contacts and bridge members integrally interconnecting the first contacts, said bridge members composed of said horizontal bridges interconnecting the first contacts arranged along the row of the matrix and vertical bridges interconnecting two adjacent first contacts arranged in pairs along the column of the matrix, said pairs of the first contacts interconnected by said vertical bridges in one column of the matrix being staggered with respect to the pairs of the interconnected first contacts in the adjacent column of the matrix so that the first contacts of the matrix are interconnected through said horizontal and vertical bridges, said plastic material forming the first substrate filling spaces between the rows of the first contacts as well as between adjacent pairs of the first contacts arranged along the column of the matrix.

15. The method as set forth in claim 13, wherein said first contacts are exposed on opposite surfaces of the first plastic molded substrate at substantially equal exposure ratio of the first contacts to the first substrate.

16. The method as set forth in claim 13, wherein said second contacts are formed as integral parts of a second conductive plate mounted on the second substrate of a ceramic material.

17. The method as set forth in claim 1, wherein said thermoelectric bar has opposed upper and lower faces, opposite side faces, and opposite end faces at the longitudinal ends thereof, said thermoelectric bar having cleavage planes extending generally along said opposed side faces, said upper and lower faces generally perpendicular to said cleavage planes being bonded respectively to said first and second contacts.

18. The method as set forth in claim 17, wherein said cutting of the thermoelectric bar is made at substantially perpendicular to said cleavage planes.

19. The method as set forth in claim 1, wherein said first conductive plate is of a unitary structure having the matrix of the first contacts and bridge members integrally interconnecting the first contacts, said bridge members composed of said horizontal bridges interconnecting the first contacts arranged along the row of the matrix and vertical bridges interconnecting two adjacent first contacts arranged in pairs along the column of the matrix, said pairs of the first contacts interconnected by said vertical bridges in one column of the matrix being staggered with respect to the pairs of the interconnected first contacts in the adjacent column of the matrix so that the first contacts of the matrix are interconnected through said horizontal and vertical bridges, said horizontal and vertical bridges having a thickness less than said first contacts.

20. The method as set forth in claim 12, wherein said vertical bridge defines a recess with respect the adjacent first contacts for absorbing heat stress applied to the first contacts.

21. The method as set forth in claim 12, wherein said first conductive plate includes a pair of matrices of said first contacts, said matrices being separated in the row direction by a slit in said first conductive plate.

22. The method as set forth in claim 12, wherein said horizontal bars of reduced thickness are flush with a top surface of the adjacent first contacts on which said thermoelectric bar is placed so as to define a bottom-open recess between the adjacent first contacts arranged in the row of the matrix.

23. The method as set forth in claim 12, wherein said vertical bars of reduced thickness are flush with a bottom surface of the adjacent first contacts on which said first substrate is bonded so as to define a top-open recess between the adjacent first contacts.

24. The method as set forth in claim 19, wherein said first conductive plate is of a unitary structure having an electrical terminal for connection with an external power source, in addition to said first contacts and said horizontal and vertical bridges.

25. The method as set forth in claim 24, wherein said electrical terminal is integrally connected to the matrix of the first contacts through a plurality of removable joints at different portions of the matrix such that the number of the thermoelectric chips forming the series circuit thereof can be varied by selectively leaving one of the joints while cutting off the other joints.

26. The method as set forth in claim 19, wherein said first conductive plate is of a unitary structure including a frame which surrounds the matrix of said first contacts and is interconnected thereto.

27. The method as set forth in claim 26, wherein said frame has a thickness less than the first contacts and is flush with the bottom surface of the first contacts on which the first contacts are bonded to said first substrate.

28. The method as set forth in claim 26, wherein said frame is provided with a portion for receiving a temperature sensor for the thermoelectric module.

29. The method as set forth in claim 1, wherein said second contacts are formed as integral parts of a second conductive plate of which configuration is identical to the first conductive plate.

30. The method as set forth in claim 1, wherein said thermoelectric bar is coated on its surface bonded to the first contacts with a welding layer of at least one material selected from the group consisting of Sn, Bi, Ag, and Au.

31. The method as set forth in claim 1, wherein said thermoelectric bar is coated on its surface to be bonded to the first contacts with a welding layer of Cu.

32. The method as set forth in claim 1, wherein a sealing enclosure is held between the first and second substrates for sealing the series circuit of the thermoelectric chips and the associated first and second contacts between the first and second substrates.

33. The method as set forth in claim 32, wherein said second contacts are formed as integral parts of a second conductive plate, said first and second conductive plates being each of a unitary structure including each one of first and second frames which surrounds each matrix of the first and second contacts, said first and second frames being bonded to opposite surfaces of said sealing enclosure.

34. The method as set forth in claim 33, wherein the opposite surfaces of said sealing enclosure is formed with plated layers for welding, respectively to said first and second frames of the first and second conductive plates.

35. The method as set forth in claim 32, wherein said sealing enclosure is integrally molded with one of the first and second substrates made of dielectric plastic material.

36. The method as set forth in claim 32, wherein said second contacts are formed as integral parts of a second conductive plate, each of said first and second conductive plates including an electrical terminal for connection with an external power source, said electrical terminal disposed outwardly of said sealing enclosure.

37. The method as set forth in claim 1, wherein the thermoelectric bar having a width less than the corresponding width of said first contact.

* * * * *

UNITED STATES PATENT AND TRADEMARK OFFICE
CERTIFICATE OF CORRECTION

PATENT NO.   :   5,950,067

DATED        :   September 7, 1999

INVENTOR(S)  :   MAEGAWA et al.

It is certified that error appears in the above-identified patent and that said Letters Patent is hereby corrected as shown below:

Item [22] delete "Jun. 3 1997" and insert therefor --May 27, 1997--.

Item [30] delete "May 27, 1996" and insert therefor --May 28, 1996--.

Signed and Sealed this

Thirteenth Day of June, 2000

Attest:

Q. TODD DICKINSON

*Attesting Officer*                *Director of Patents and Trademarks*